United States Patent
Vella-Coleiro et al.

(10) Patent No.: US 11,387,920 B2
(45) Date of Patent: Jul. 12, 2022

(54) METHODS AND APPARATUSES FOR MEASURING THE DISTANCE TO A PASSIVE INTERMODULATION SOURCE

(71) Applicant: CommScope Technologies LLC, Hickory, NC (US)

(72) Inventors: George P. Vella-Coleiro, Summit, NJ (US); XiaoHua Hou, Richardson, TX (US)

(73) Assignee: CommScope Technologies LLC, Hickory, NC (US)

(*) Notice: Subject to any disclaimer, the term of this patent is extended or adjusted under 35 U.S.C. 154(b) by 0 days.

(21) Appl. No.: 17/121,881

(22) Filed: Dec. 15, 2020

(65) Prior Publication Data

US 2021/0099239 A1    Apr. 1, 2021

Related U.S. Application Data

(63) Continuation of application No. 16/682,115, filed on Nov. 13, 2019, now Pat. No. 10,897,317, which is a
(Continued)

(51) Int. Cl.
*H04B 17/00* (2015.01)
*H04B 3/46* (2015.01)
(Continued)

(52) U.S. Cl.
CPC ......... *H04B 17/0085* (2013.01); *G01R 23/20* (2013.01); *H04B 3/46* (2013.01);
(Continued)

(58) Field of Classification Search
CPC .. H04B 17/0085; H04B 17/336; H04B 17/17; H04B 17/29; H04B 17/15; H04B 3/46
(Continued)

(56) References Cited

U.S. PATENT DOCUMENTS 5,844,939 A    12/1998   Scherer et al.
5,974,301 A    10/1999   Palmer et al.
(Continued)

FOREIGN PATENT DOCUMENTS

WO    2012009757 A1    1/2012

OTHER PUBLICATIONS

"Notification of Transmittal of the International Search Report and the Written Opinion of the International Searching Authority, or the Declaration, corresponding to International Application No. PCT/US2019/019978, dated Jun. 28, 2019".
(Continued)

*Primary Examiner* — Emmanuel Bayard
(74) *Attorney, Agent, or Firm* — Myers Bigel, P.A.

(57) ABSTRACT

According to methods of performing measurements to determine a distance to a passive-intermodulation ("PIM") source, a first RF signal comprising a first frequency and a second RF signal comprising a second frequency may be applied to a device under test. A reference signal comprising a higher-order intermodulation-product of the first frequency and the second frequency may also be generated. An output signal from the device under test and the reference signal may be digitized and a calibration measurement may be applied. A phase difference between the device under test output and the reference signal may be determined. A plurality of phase differences may be determined for multiple first frequencies, and from the plurality of phase differences, a delay may be calculated, which may be multiplied by the velocity of propagation on the medium connecting the device under test to the test equipment to determine a distance to the PIM source.

20 Claims, 13 Drawing Sheets

Related U.S. Application Data continuation of application No. 16/288,452, filed on Feb. 28, 2019, now Pat. No. 10,498,465.

(60) Provisional application No. 62/636,863, filed on Mar. 1, 2018.

(51) Int. Cl.

| | | |
|---|---|---|
| *H04B 17/30* | (2015.01) | |
| *H04B 17/15* | (2015.01) | |
| *H04B 17/29* | (2015.01) | |
| *H04B 17/16* | (2015.01) | |
| *H04B 17/10* | (2015.01) | |
| *H04B 17/17* | (2015.01) | |
| *G01R 23/20* | (2006.01) | |
| *G01R 31/08* | (2020.01) | |

(52) U.S. Cl.
CPC .......... *H04B 17/104* (2015.01); *H04B 17/15* (2015.01); *H04B 17/16* (2015.01); *H04B 17/17* (2015.01); *H04B 17/29* (2015.01); *H04B 17/30* (2015.01); *G01R 31/08* (2013.01)

(58) Field of Classification Search
USPC .............. 375/219–220, 224, 226, 228, 297
See application file for complete search history.

(56) References Cited

U.S. PATENT DOCUMENTS

| | | | |
|---|---|---|---|
| 8,410,786 B1 | 4/2013 | Bradley | |
| 8,903,324 B1 * | 12/2014 | Bradley | H04B 17/345 455/67.11 |
| 9,176,180 B1 | 11/2015 | Bradley et al. | |
| 9,354,262 B2 | 5/2016 | Yagi | |
| 9,391,719 B2 | 7/2016 | Neidhardt et al. | |
| 9,455,792 B1 * | 9/2016 | Truesdale | H04B 17/11 |
| 10,469,296 B1 * | 11/2019 | Noujeim | H04L 27/16 |
| 10,498,465 B2 | 12/2019 | Vella-Coleiro et al. | |
| 2010/0164504 A1 * | 7/2010 | Bradley | H04B 17/17 324/520 |
| 2013/0054169 A1 | 2/2013 | Neidhardt et al. | |
| 2013/0182753 A1 * | 7/2013 | Delforce | H04B 17/17 375/228 |
| 2014/0002097 A1 * | 1/2014 | Yagi | H04B 3/46 324/520 |
| 2016/0028497 A1 * | 1/2016 | Holt | H04B 17/0085 375/228 |
| 2017/0126337 A1 * | 5/2017 | Schwab | H04L 27/12 |
| 2017/0149463 A1 | 5/2017 | Kang et al. | |
| 2017/0237484 A1 | 8/2017 | Heath et al. | |
| 2017/0324485 A1 | 11/2017 | Patel et al. | |
| 2018/0081047 A1 | 3/2018 | Gander | |
| 2018/0219636 A1 * | 8/2018 | Gale | H04B 17/26 |

OTHER PUBLICATIONS

Oppenheim, Alan V., Ronald W. Schafer, and John R. Buck. "Chapter 11: Discrete Hilbert Transforms." In "Discrete-time signal processing." 775-801. Upper Saddle River, N.J: Prentice Hall, 1999.
R. Andraka, "A survey of CORDIC algorithms for FPGA based computers," in Proceedings of the 6th ACM/SIGDA International Symposium on Field Programmable Gate Arrays (FPGA '98), pp. 191-200, Feb. 1998.
S. L. Marple, Jr. "Computing the Discrete-Time Analytic Signal via FFT," IEEE Transactions on Signal Processing, vol. 47, No. 9, 2600-2603. Sep. 1999.

* cited by examiner

METHODS AND APPARATUSES FOR MEASURING THE DISTANCE TO A PASSIVE INTERMODULATION SOURCE

CROSS-REFERENCE TO RELATED APPLICATIONS

The present application is a continuation of U.S. application Ser. No. 16/682,115, filed on Nov. 13, 2019, which is in turn a continuation of U.S. application Ser. No. 16/288,452, filed on Feb. 28, 2019, which claims priority to U.S. Provisional Application No. 62/636,863, filed Mar. 1, 2018, in the United States Patent and Trademark Office, and entitled "METHODS AND APPARATUSES FOR MEASURING THE DISTANCE TO A PASSIVE INTERMODULATION SOURCE," the entire contents of each of which are incorporated by reference as if set forth herein for all purposes.

TECHNICAL FIELD

The present disclosure relates generally to communications systems and, more particularly, to methods and apparatus for testing components used in radio frequency ("RF") communications systems.

BACKGROUND

Passive intermodulation distortion ("PIM" distortion, or simply "PIM" herein) is a form of electrical interference that may occur when two or more RF signals encounter non-linear electrical junctions or materials along an RF transmission path. Such non-linearities may act like a mixer causing the RF signals to generate new RF signals at mathematical combinations of the original RF signals. These newly generated RF signals may be referred to as "intermodulation products." The newly generated RF signals may fall within the bandwidth of existing RF signals. This may occur, for example, when signals transmitted through a device generate intermodulation products that fall in the same bandwidth of signals that are received through the same device. If this occurs, the noise level experienced by the existing RF signals in the receiver bandwidth is increased. When the noise level is increased, it may be necessary to reduce the data rate and/or the quality of service. PIM can be an important interconnection quality characteristic, as PIM generated by a single low quality interconnection may degrade the electrical performance of the entire RF communications system. Thus, ensuring that components used in RF communications systems will generate acceptably low levels of PIM may be desirable.

The above-described intermodulation products arise because non-linear systems generate harmonics in response to sinusoidal inputs. For example, when a signal having a first frequency $S_{f1}$ is input to a non-linear system, then the resulting output signal will include signals at integer multiples of the input frequency. When two or more signals having different frequencies are input to a non-linear system, intermodulation products arise. For example, consider a composite input signal x(t) to a non-linear system that includes signals at two different frequencies:

$$x(t)=A_1 \sin(2\pi f_1 t+\varphi_1)+A_2 \sin(2\pi f_2 t+\varphi_2) \quad (1)$$

In Equation (1) above, $A_i$ and $\varphi_i$ are the amplitudes and phases of the signals at the two different frequencies $f_1$ and $f_2$. These signals are passed through a non-linearity. The resulting output signal will include components at the frequencies $f_1$, $f_2$ of the two input signals, which are referred to as the fundamental components, as well as linear combinations of these fundamental components having the form:

$$k_1 f_1 + k_2 f_2 \quad (2)$$

where $k_1$ and $k_2$ are arbitrary integers (including zero) which can have positive or negative values. These components are the intermodulation products and harmonics, and will have amplitudes and phases that are a function of the non-linearity and the composite input signal x(t).

The order of an intermodulation product is the sum of the absolute value of the coefficients $k_i$ included in the intermodulation product. In the above example where the composite input signal x(t) includes signals at two different frequencies, the third order intermodulation products are the intermodulation products where:

$$|k_1|+|k_2|=3, \text{ where } |k_1|,|k_2|<=3 \quad (3)$$

In the above example, the third-order intermodulation products will be at the following frequencies:

$$2f_1-f_2$$

$$2f_2-f_1$$

Odd-order intermodulation products are typically of the most interest as these products are the ones that tend to fall in the vicinity of the frequencies of the fundamental components, and the third order intermodulation products have the largest magnitude of the odd-order intermodulation products.

PIM may be caused by, for example, inconsistent metal-to-metal contacts along an RF transmission path, particularly when such inconsistent contacts are in high current density regions of the transmission path such as inside RF transmission lines, inside RF components, or on current carrying surfaces of an antenna. Such inconsistent metal-to-metal contacts may occur, for example, because of contaminated and/or oxidized signal carrying surfaces, loose connections between two connectors, metal flakes or shavings inside RF components or connections and/or poorly prepared soldered connections (e.g., a poor solder termination of a coaxial cable onto a printed circuit board). PIM may arise in a variety of different components of an RF communications system. For example, non-linearities may exist at the interconnections in an RF communications system where cables such as coaxial cables are connected to each other or to RF equipment. PIM may also arise in other components of an RF communications system such as duplexers, cross-band couplers, interference mitigation filters and the like. PIM may also arise on or within radiating elements of the RF communications system such as parabolic antennas or phased array antenna elements. The non-linearities that give rise to PIM may be introduced at the time of manufacture, during installation, or due to electro-mechanical shift over time due to, for example, mechanical stress, vibration, thermal cycling, and/or material degradation.

SUMMARY

It has been recognized that, in addition to knowing a device under test has a PIM source therein, it would also be helpful to know where in the device under test the PIM source is located, so that the device may be redesigned, corrected, altered, or the like. Distance to PIM measurement may also be useful in field testing where access to the device is through a length of cable, and PIM is potentially occurring either along the cable or in the device at the end of the cable.

It has been recognized by the inventors that current systems and methods for detecting an approximate location of a PIM source are limited. For example, U.S. Pat. No. 9,354,262 to Yagi uses an inverse fast Fourier transform approach (IFFT) which requires measurements to be made over a wide frequency range to provide adequate distance resolution. U.S. Pat. No. 9,391,719 to Neidhardt et al. uses a phase difference technique which requires a sophisticated (and expensive) Vector Network Analyzer, as well as requires the maintenance of phase coherence as the frequency is changed. U.S. Pat. No. 9,176,180 to Bradley et al. requires frequency modulation of one of the input sources. U.S. Patent Application No. 2017/0126337 to Schwab et al. uses a correlation method, which potentially suffers from poor time and distance resolution when the bandwidth of the spread-spectrum signal is restricted by the bandwidth of the device under test, as may be typically the case.

Aspects of the present disclosure are directed toward providing methods and apparatuses having an ability to measure the distance to a PIM source located at or within the device under test with acceptable resolution, in the presence of a second PIM source located at the test equipment, using a bandwidth which is sufficiently narrow to be compatible with the device under test, and without requiring sophisticated or expensive test equipment.

Some aspects provide a method of determining a distance to a passive intermodulation source. The method may include: applying a first RF signal and a second RF signal to a device under test; generating, based on the first RF signal and the second RF signal, a reference signal comprising a higher-order PIM product; receiving, from the device under test, an output signal that includes a PIM signal generated from mixing of the first and second RF signals; determining a phase difference between the reference signal and the output signal; determining a delay of the output signal based on the phase difference between the reference signal and the output signal; and determining a distance to the PIM source based on the delay.

Some aspects provide a method of determining a distance to a passive intermodulation source. The method may include: generating a plurality of first RF signals, each first RF signal comprising a different first frequency; generating, based on each of the plurality of first RF signals, a reference signal, resulting in a plurality of reference signals respectively corresponding to the plurality of first RF signals; applying each of the plurality of first RF signals and a second RF signal to a device under test, resulting in a plurality of output signals respectively corresponding to the plurality of first RF signals; processing each of the plurality of output signals to determine a phase difference between each output signal and the reference signal that corresponds to the output signal; and calculating a distance based on the determined phase differences.

Some aspects provide a passive intermodulation measurement apparatus. The apparatus may include: at least one signal generator that is configured to generate a first RF signal and a second RF signal; a test apparatus configured to hold a device under test, the device under test configured to receive the first and second RF signals from the at least one signal generator; a receiver that is coupled to an output of the device under test so as to receive and down-convert an output signal that includes a PIM signal generated by mixing of the first RF signal and the second RF signal within the device under test; a frequency-doubler configured to double a frequency of the first RF signal, resulting in a frequency-doubled first RF signal; a mixer configured to mix the frequency-doubled first RF signal and the second RF signal, resulting in a reference signal; and a processor configured to determine a phase difference between the reference signal and the output signal.

Some aspects provide a method of determining a distance to a passive intermodulation ("PIM") source. The method may include applying a first RF signal and a second RF signal to a device under test; generating, based on the first RF signal and the second RF signal, a reference signal comprising a coupled portion of the first RF signal and a coupled portion of the second RF signal; receiving, from the device under test, an output signal that includes a PIM signal generated from mixing of the first and second RF signals; determining a phase difference between the reference signal and the output signal; determining a delay of the output signal based on the phase difference between the reference signal and the output signal; and determining a distance to the PIM source based on the delay.

DETAILED DESCRIPTION

Figure 1:
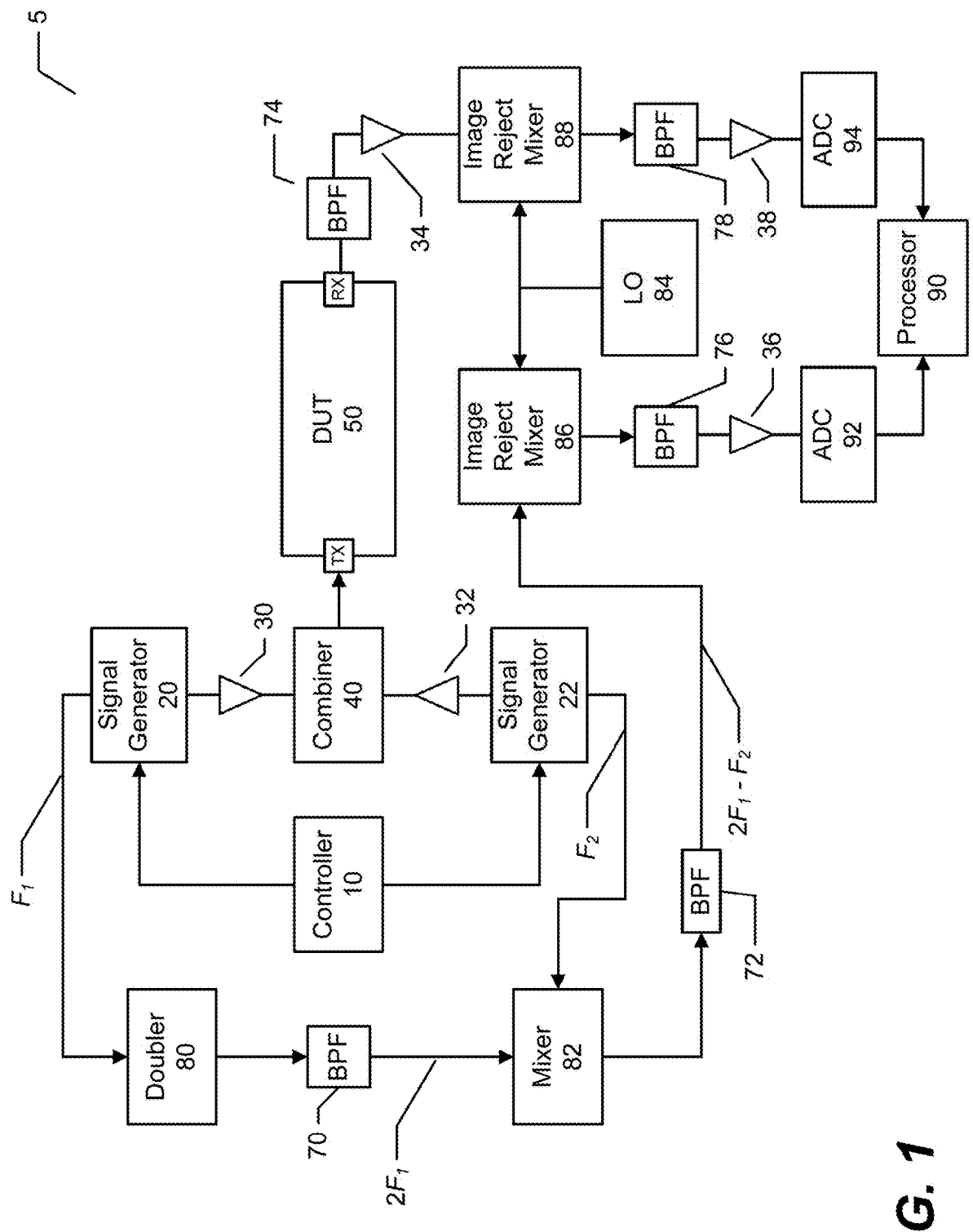
FIG. 1 is a block diagram of a distance-to-PIM measurement apparatus, according to embodiments of the present inventive concepts.

Measuring and determining a distance to a PIM source may be important for providing high performance RF communications systems.

Pursuant to embodiments of the present inventive concepts, methods of determining a distance to a PIM source are provided in which a potential distance or distances to a PIM source may be identified. As a result, a source of PIM in a device under test, as provided by the methods and apparatuses described herein, may be located or may be narrowed down to a number of possible locations. The measurement methods disclosed herein may more accurately identify a location or locations in devices under test that have unacceptable PIM performance—before such devices are mounted, for example, on an antenna tower—and may also avoid the need and expense of sophisticated measurement equipment.

Equation 4 illustrates a known relationship between a delay time, $\tau$, a phase angle, $\varphi$, and frequency, f.

$$\tau = -d\varphi/d(2\pi f) \quad (4)$$

Pursuant to the distance-to-PIM measurement methods according to embodiments of the present inventive concepts, Equation 4 may be used to determine a potential distance or potential distances to a PIM source, where the distance, which is obtained by dividing the delay time by the signal propagation velocity, may be calculated based on phase differences between an intermodulation product generated by a non-linearity in a device under test in response to two or more test signals and a "reference" intermodulation product that is generated from the two or more test signals.

In accordance with methods provided herein, an excitation signal may be generated and applied to a device under test. The excitation signal may comprise RF signals emitted from two RF signal sources. For example, the two signal sources may be more specifically two continuous wave sources, and the excitation signal may be more specifically a first continuous wave signal from the first continuous wave source and a second continuous wave signal from the second continuous wave source. The first signal may have a first frequency and the second signal may have a second frequency, where the first frequency ($F_1$) and the second frequency ($F_2$) are selected such that $F_1 < F_2$ and such that the frequencies are within a transmit band of the device under test, and also may be selected such that a third-order intermodulation product (e.g., $2F_1 - F_2$ or $2F_2 - F_1$) is within the receive band of the device under test. Although the example embodiments illustrated herein use third-order products, and more specifically $2F_1 - F_2$, it is within the scope of the present disclosure that other frequencies and/or other order products may be utilized.

The signals may be amplified and/or combined prior to their application to the device under test, and an output signal may be received from the device under test that includes a PIM signal generated from mixing of the first and second signals.

Separate from the application of the first RF signal and the second RF signal to the device under test, a reference signal may be generated. The reference signal may be a reference intermodulation product. For example, the first signal may be frequency-doubled and the frequency-doubled first signal may be mixed with the second signal. This mixed signal may be bandpass filtered to provide a reference signal that comprises a frequency of a higher-order intermodulation product. In the present example, the reference signal is a third order intermodulation product of the respective first RF signal and the second RF signal, wherein a center frequency of the reference signal is a frequency that is twice a center frequency of the respective first signal (e.g., a center frequency of the frequency-doubled first signal) minus a center frequency of the second signal (here, $2F_1 - F_2$).

The output signal from the device under test and the generated reference signal may be received, for example, at respective receivers, which may comprise, for example, an image reject mixer, a bandpass filter, and/or an analog/digital converter. In some embodiments, the image reject mixer and/or the bandpass filter may be used to provide and down-convert the output signal to an intermediate frequency signal. The intermediate frequency signal may then be digitized using the analog/digital converter. In some aspects, the output signal and the reference signal may be digitized directly without down-conversion.

The digitized reference signal and the digitized output signal may then be used to calculate a phase difference between the signals. Although the phase difference may be calculated directly from the received signals alone, it has been recognized that while the testing apparatus described herein is constructed preferably using low-PIM components, to avoid generation of PIM signals that may interfere with the measurement methods, it is also recognized that some low-level PIM signals may nevertheless be generated, even when care is taken. These low-level PIM signals may interfere with the PIM signal from the device under test and may cause an error in the measurement of the phase difference.

To avoid this error, a calibration measurement of the PIM of the testing apparatus may be made and used as a calibration offset. Instead of the device under test, a low-PIM termination or connection may be used, and methods of measurement described herein may be performed. For example, where the device under test is as a two-port device having an input (or transmit) port and an output (or receive) port, a low-PIM connection may be used. Where the device under test is a single-port device, a low-PIM termination may be used. In some embodiments, calibration measurements may be made using an RF relay to switch between the termination or connection and the device under test at each $F_1$ frequency so that the phase of the source is the same for the two measurements. However, this may increase the time needed to perform the measurement, which may be undesirable. Accordingly, in some embodiments, calibration measurements may be made sequentially at each of the set of frequencies $F_1$ prior to performing the measurement process using the device under test. In some embodiments, calibration measurements may be performed periodically, with one or several (e.g., two or more) devices under test being measured between calibrations.

The phase difference, $\varphi$, between the reference signal and the PIM signal from the device under test may be obtained using the following equations. In the following equations, $D_{r1}$ and $D_{p1}$ denote the digitized reference signal and the digitized PIM signal with the low-PIM calibration connection or termination, respectively (in other words, $D_{r1}$ and $D_{p1}$ denote data used to determine the calibration offset). $D_{r2}$ and $D_{p2}$ denote the digitized reference signal and the digitized PIM signal with the device under test, respectively; $D_{r1T}$ and $D_{r2T}$ denote the transpose of the column vectors $D_{r1}$ and $D_{r2}$, respectively; $D_{r1TH}$ and $D_{p1H}$ denote the Hilbert transform of $D_{r1T}$ and $D_{p1}$, respectively, and * denotes matrix multiplication:

$$Q = \sqrt{\{(D_{r1T} * D_{r1})(D_{r2T} * D_{r2})\}} \quad (5)$$

$$C = (D_{r1T} * D_{r2})/Q \quad (6)$$

$$S=(D_{r1TH} * D_{r2})/Q \quad (7)$$

$$D_p = D_{p2} - (CD_{p1} + SD_{p1H}) \quad (8)$$

$$\varphi = \arcsin[(D_{r2T} * D_p)/\sqrt{\{(D_{r2T} * D_{r2})(D_{pT} * D_p)\}}] \quad (9)$$

The calculated phase difference may be stored in a memory unit. Additional data may be desirable, and the operations discussed above may be repeated over a range of frequencies for the first signal. This may result in additional calculated phase differences between generated reference signals and signals output (which are both based on the first RF signal) and increases a number of stored data points.

In some embodiments, the number of data points that are stored is a function of the sampling rate and the signal-to-noise ratio. Once sufficient data has been acquired, then a delay may be calculated. Here again is Equation (4).

$$\tau = -d\varphi/d(2\pi f) \quad (4)$$

Based on Equation (4) and the calculated phase differences, a delay ($\tau$) may be determined based on, for example, a slope of a best-fit straight line on a plot of $\varphi$ versus $2\pi(2F_1-F_2)$. Using this delay ($\tau$), a distance may be calculated. This distance may be calculated by multiplying the delay ($\tau$) by the velocity of propagation on the medium that connects the device under test to the test equipment. The velocity of propagation of the medium may be determined from a lookup table or other reference source. For example, coaxial cables will typically have a rated velocity of propagation, which is typically about 0.66-0.83, or 66%-83% the speed of light in a vacuum.

Figure 9:
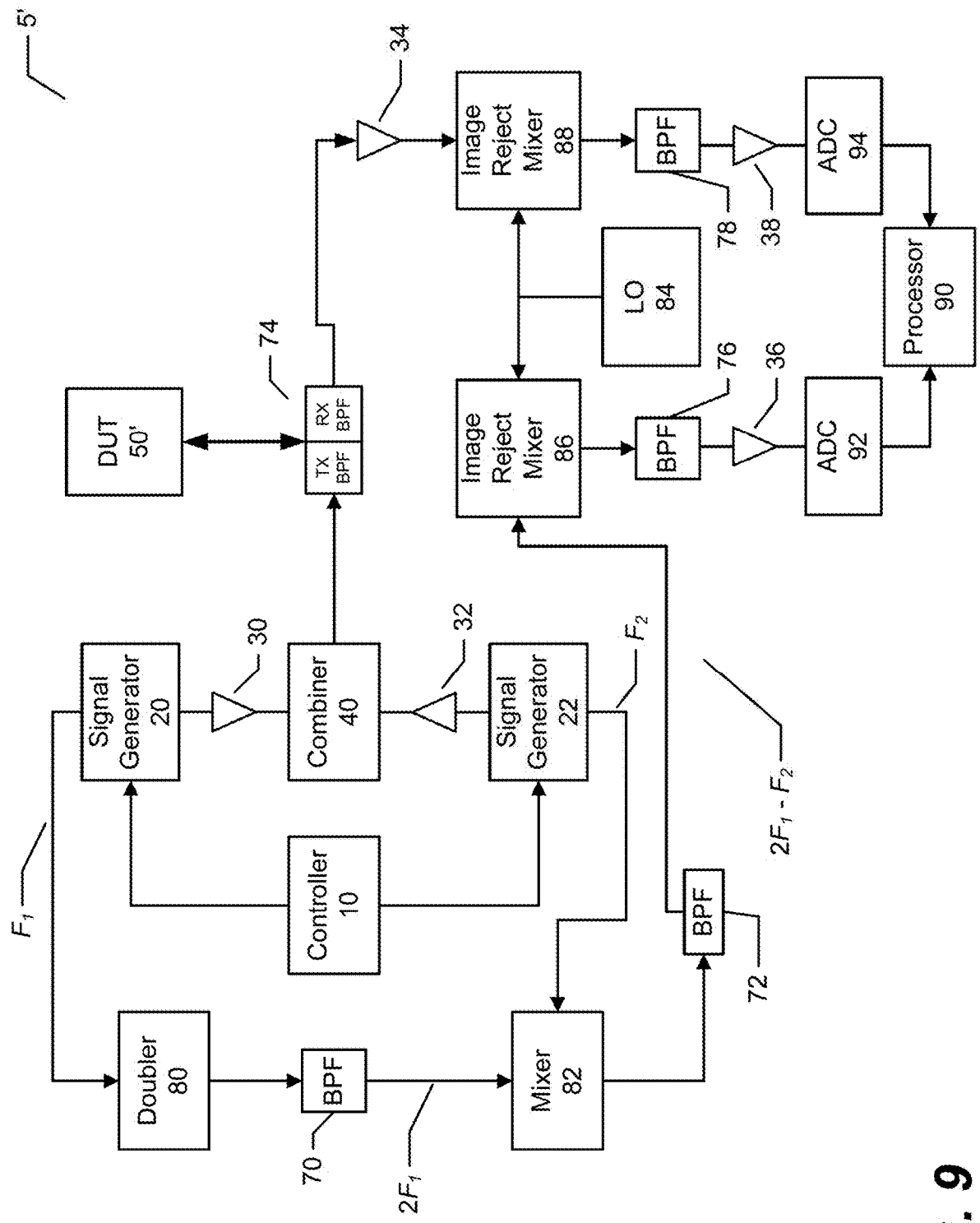
FIG. 9 is a block diagram of a distance-to-PIM measurement apparatus, according to embodiments of the present inventive concepts.

Turning now to FIG. 1, a simplified block diagram of a distance-to-PIM measurement apparatus 5 is illustrated. As shown in FIG. 1, the measurement apparatus 5 may include a controller 10, a pair of signal generators 20, 22, a plurality of power amplifiers 30, 32, a plurality of low noise amplifiers 34, 36, 38, a combiner 40, a device under test 50 (which may be mounted, for example, at a test location or on a test bed), a plurality of bandpass filters 70, 72, 74, 76, 78, a doubler 80, a mixer 82, first and second image reject mixers 86, 88, a local oscillator 84, a pair of analog-to-digital converters (ADCs) 92, 94, and a processor 90. It will be appreciated that the distance-to-PIM measurement apparatus 5 may include other elements that are not depicted in FIG. 1. It will also be appreciated that some devices illustrated in FIG. 1 are optional and/or combinable with other elements. For example, the outputs of the first signal generator 20 and the second signal generator 22 may be of sufficient power that the power amplifiers 30, 32 may be omitted. Although the device under test 50 is illustrated as a two-port device having an input (or transmit) port and an output (or receive) port, it will be appreciated that the device under test 50 may be a single-port device, and a diplexer, duplexer, or the like may be employed to separate the PIM signal from the input signal. For example, FIG. 9 shows a single simplified block diagram of a distance-to-PIM measurement apparatus 5' in which device under test 50' is a single port device. The remaining components of FIG. 9 are similar to those of FIG. 1, and identical reference signs used in the figures refer to similar components. Therefore, discussion of components herein with respect to FIG. 1 is similarly applicable to the components of FIG. 9. In some embodiments, the input port of the device under test 50 may be coupled to a bandpass filter (not shown in FIG. 1).

In order to conduct a measurement of the distance-to-PIM on the device under test 50, each signal generator 20, 22 may generate an RF signal that may be fed to the combiner 40 through respective connections (coaxial cables or the like) and which may be amplified respectively by the power amplifiers 30 and 32. The two RF signals that are supplied to the device under test 50 are the signals that are used to generate the PIM signals (i.e., the above-described intermodulation products). These RF signals may be continuous wave RF signals (i.e., an RF signal at a discrete frequency that has almost 0 bandwidth). The first RF signal may have a center frequency of $F_1$ and the second RF signal may have a center frequency of $F_2$. If the device under test 50 has non-linearities such as for example, inconsistent metal-to-metal contacts or other non-linear electrical junctions, the two generated signals will mix, resulting in the generation of intermodulation products in the manner discussed above. A signal comprising intermodulation products generated by a PIM source in the device under test 50 may be referred to herein as the "PIM signal."

The signal generators 20, 22 may be, for example, signal generation test equipment or actual radios such as, for example, base station radios or remote radio heads. In some embodiments, a single signal generator may be used that generates multiple excitation signals. In some embodiments, the signal generators 20, 22 may be controlled by a controller 10, although such a controller 10 may be optional. The controller 10 may be any suitable processing/control device that may control various of the components of the distance-to-PIM measurement apparatus 5 including, for example, the signal generators 20, 22. In some aspects, the controller 10 may also control the ADCs 92, 94, and/or the processor 90. The controller 10 may be, for example, a personal computer.

The combiner 40 may combine the first and second RF signals or other RF signals output by the first and second signal generators 20, 22, and an output of the combiner 40 may be connected to an input port of the device under test 50. The device under test 50 may be any device which is to be subject to PIM and for which a distance-to-PIM is sought. Example types of single-port and multiple-port devices include antennas (such as base station antennas), duplexers, diplexers, cross-band couplers, interference mitigation filters, individual radiating elements, and the like. The device under test 50 may be a discrete device or a series of connected devices.

Any PIM signal generated by the device under test 50 will be output at an output of the device under test 50. The output of the device under test 50 may be fed to bandpass filter 74 and then to amplifier 34. In some embodiments, this bandpass filter 74 may filter the transmit frequency band and pass the receive frequency band for the communications system at issue. After bandpass filtering and amplification, the PIM signal may be down-converted and/or digitized, using, for example, an image reject mixer 88, a bandpass filter 78, an amplifier 38, and/or an ADC 94.

In some aspects, for example, where the frequency of the PIM signal is capable of digitization directly by the ADC 94, the local oscillator 84 and image reject mixer 88 may be omitted. Alternatively, as shown in FIG. 1, before the signal is digitized it may be down-converted to an intermediate frequency (IF) using the image reject mixer 88, which may suppress an unwanted upper-frequency image. Additional suppression of the unwanted image may be provided by a bandpass filter 78.

In some aspects, further down-conversion of the signal is obtainable by under-sampling the ADC 94. For example, if the IF is 125 MHz and the sampling rate is 100 Ms/s, the digitized signal has a frequency of 25 MHz (125-100 MHz). The digital signal can then be decimated to reduce the sampling rate further, facilitating subsequent processing.

Outputs from the ADC 94 may be fed into the processor 90, which will be described in greater detail below.

As also illustrated in FIG. 1, outputs from the first signal generator 20 and second signal generator 22 may also be mixed, resulting in a reference signal that comprises a third-order intermodulation product. As an example, the output of first signal generator 20 may be doubled using a frequency doubler 80. A bandpass filter 70 may be used to filter out signals other than the doubled frequency (e.g., the fundamental frequency of the first RF signal). The output from the frequency doubler 80 and bandpass filter 70 may then be input, along with the output from the second signal generator 22, into the mixer 82. The output of the mixer 82 may be filtered by bandpass filter 72 to filter out signals other than the third-order intermodulation product (e.g., fundamental components, other intermodulation products, or noise). Thus, the reference signal output by the mixer 82 may comprise a third order intermodulation product of the first RF signal and the second RF signal, wherein a center frequency of the reference signal is a frequency that is twice a center frequency of the first RF signal minus a center frequency of the second RF signal.

As with the output from the device under test 50, the generated reference signal may be down-converted and/or digitized, using, for example, an image reject mixer 86, a bandpass filter 76, an amplifier 36, and/or the ADC 92. In some aspects, a common local oscillator 84 may feed both the image reject mixer 88 and the image reject mixer 86. Outputs of the ADCs 92, 94, may be fed into the processor 90, which may be configured to calculate the phase difference between the two signals, calculate a delay based on the phase difference, and calculate a distance based on the delay.

As shown in FIG. 1, outputs from the same signal generators 20, 22 are used to feed both the first ADC 94 (via the device under test 50) and the second ADC 92 (via the doubler 80 and the mixer 82). However, the present inventive concepts are not limited thereto.

Figure 2:
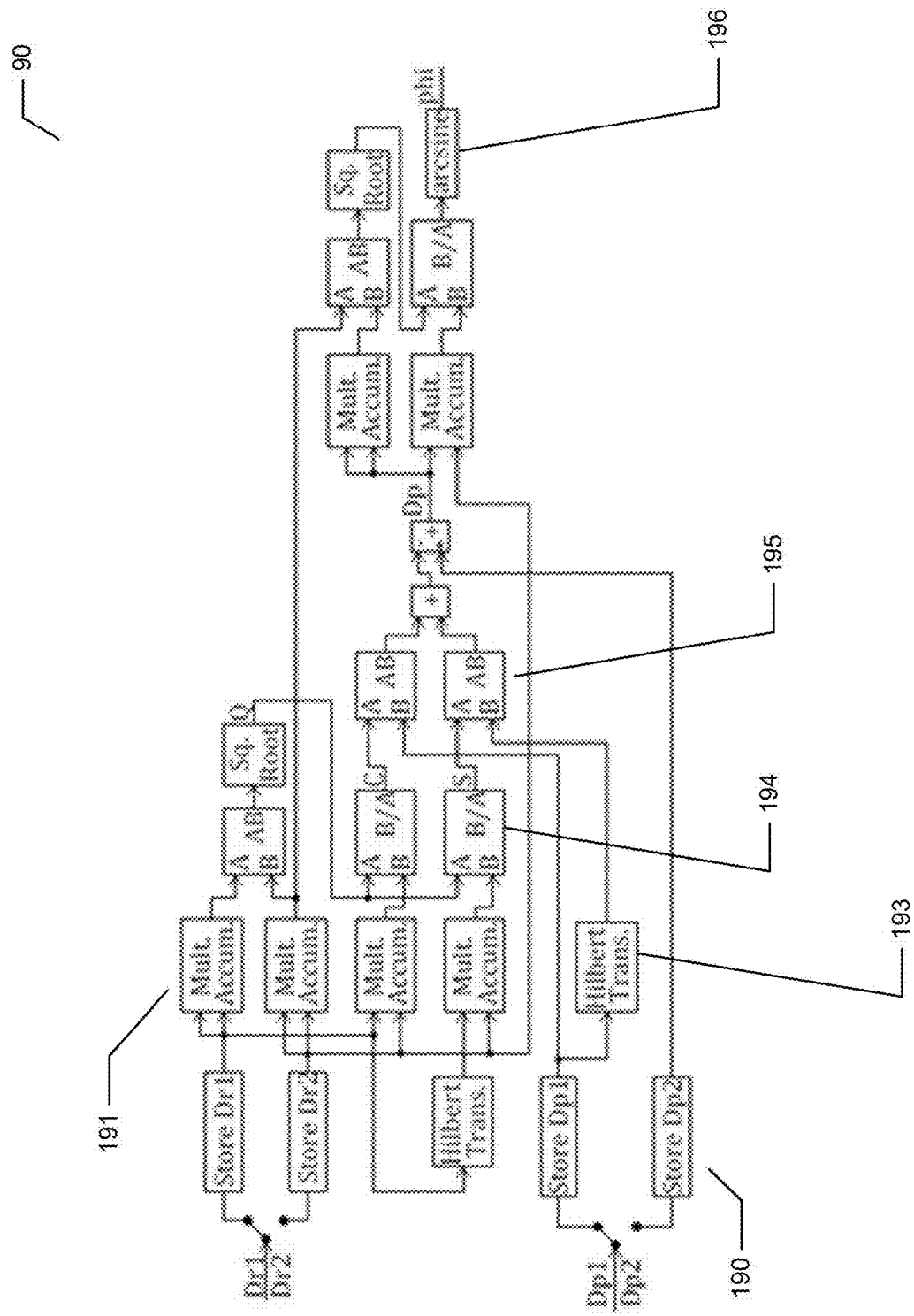
FIG. 2 is a block diagram of a processor within the distance-to-PIM test apparatus of FIG. 1, according to embodiments of the present inventive concepts.

The processor 90 may be implemented in different ways. For example, FIG. 2 is a block diagram of the processor 90 implemented using digital signal processing (DSP) devices, according to embodiments of the present inventive concepts.

As discussed above, data samples may be collected using both the device under test 50 and using a low-PIM termination. When data is collected for each of these devices, two sets of samples are stored: the samples from the generated reference signal (via second ADC 92), and the samples resulting from the output of the device or calibration termination/connection (via first ADC 94). Therefore, for each frequency at which the measurements are performed, there are four sets of data samples: device-under-test-output, device-under-test-reference, calibration-output, and calibration-reference. These samples may be stored in the "Store" components 190 illustrated in FIG. 2. The calibration-reference samples of the reference signal, Dr1, are stored in "Store Dr1" and the samples of the calibration-output signal, Dp1, in "Store Dp1". Similarly, the device-under-test-reference and device-under-test-output measurements, Dr2 and Dp2 are stored in "Store Dr2" and "Store Dp2", respectively. The remaining blocks of processor 90, illustrated in FIG. 2, provide arithmetic and/or matrix multiplication processing to provide the operands of Equations (5), (6), (7), (8), and (9). For example, matrix multiplication is performed in the multiply-accumulate units 191, division is performed in division units 194, multiplication is performed in multiplication units 195, and the Hilbert transformation is performed in Hilbert transformation unit 193. In some embodiments, the Cordic algorithm may be used to calculate the arcsine function. Another method to evaluate the arcsine function may be to use a look-up table. It will also be appreciated that some devices illustrated in FIG. 2 are optional and/or combinable with other elements.

Figure 3:
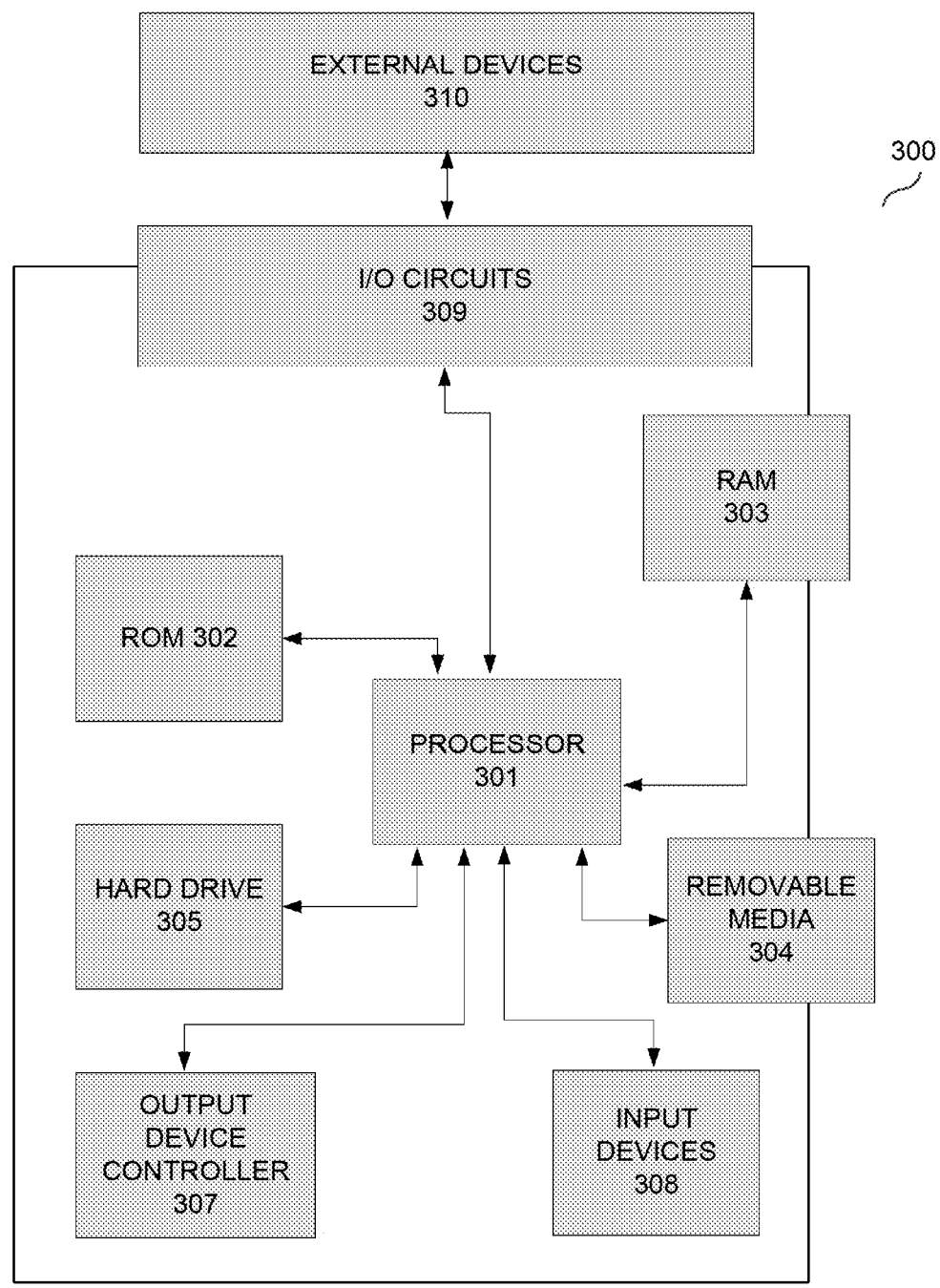
FIG. 3 is a block diagram of components of a computer device that may be used to implement one or more devices described herein.

Alternatively, processor 90 may be implemented in a general computing device specially-programmed to perform various operations, including mathematical processing to calculate a phase difference, or may be a specially-programmed computing device. FIG. 3 illustrates various components of a computing device 300 which may be used to implement one or more of the devices herein, including processor 90. FIG. 3 illustrates hardware elements that can be used in implementing any of the various computing devices discussed herein. In some aspects, general hardware elements may be used to implement the various devices discussed herein, and those general hardware elements may be specially programmed with instructions that execute the algorithms discussed herein. In special aspects, hardware of a special and non-general design may be employed (e.g., ASIC or the like). Various algorithms and components provided herein may be implemented in hardware, software, firmware, or a combination of the same.

A computing device 300 may include one or more processors 301, which may execute instructions of a computer program to perform any of the features described herein. The instructions may be stored in any type of computer-readable medium or memory, to configure the operation of the processor 301. For example, instructions may be stored in a read-only memory (ROM) 302, random access memory (RAM) 303, removable media 304, such as a Universal Serial Bus (USB) drive, compact disk (CD) or digital versatile disk (DVD), floppy disk drive, or any other desired electronic storage medium. Instructions may also be stored in an attached (or internal) hard drive 305. The computing device 300 may be configured to provide output to one or more output devices, and may include one or more output device controllers 307 to provide this output. Inputs, including user inputs, may be received via input devices 308, such as a remote control, keyboard, mouse, touch screen, microphone, or the like. The computing device 300 may also include input/output circuits 309 which may include circuits and/or devices configured to enable the computing device 300 to communicate with external devices 310 (e.g., the analog/digital converters of FIG. 1). The input/output circuits 309 may enable the computing device 300 to communicate with external devices 310.

Figure 4:
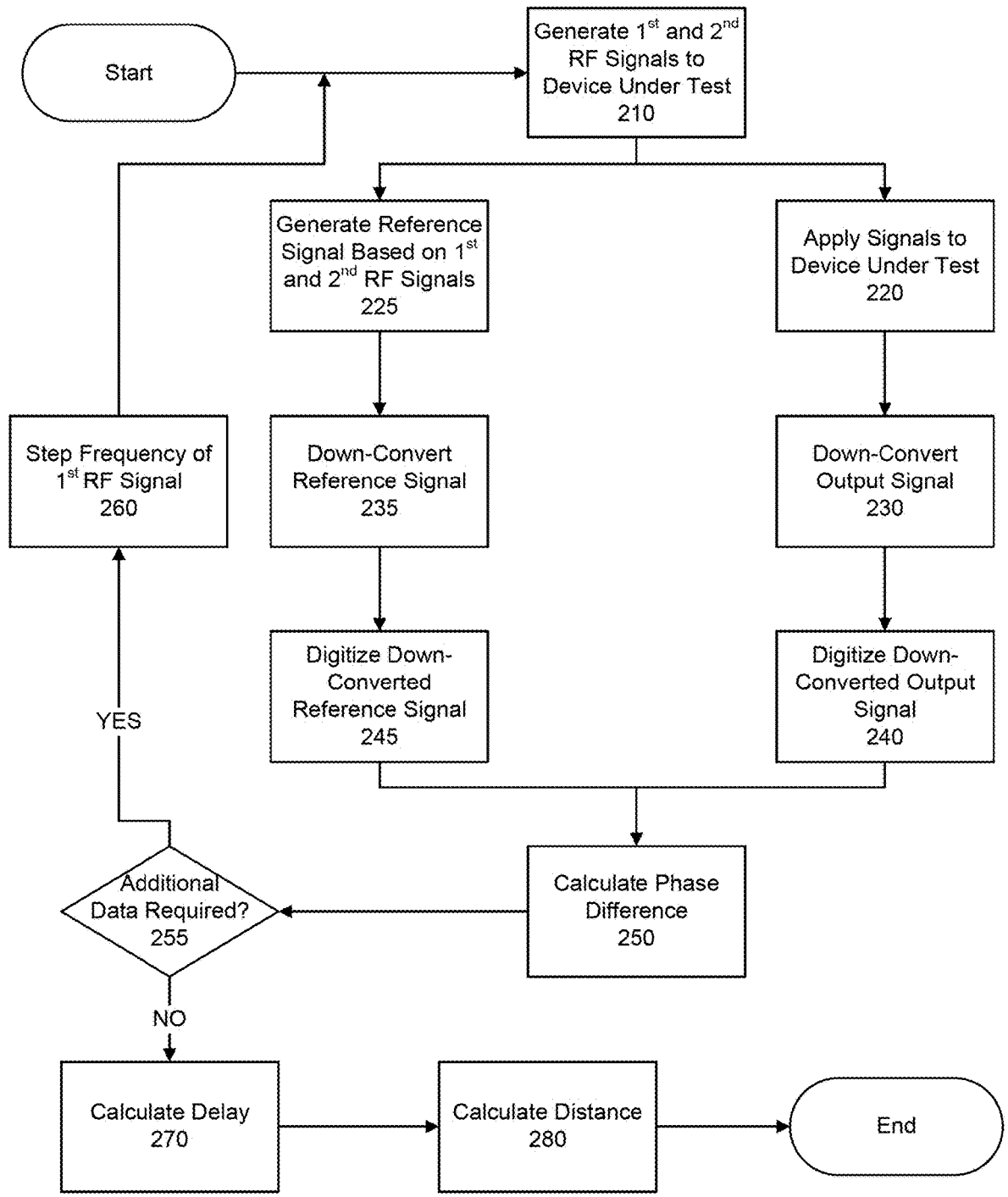
FIG. 4 is a flow chart illustrating a method of performing measurements to determine a distance to a PIM source, according to embodiments of the present inventive concepts.

FIG. 4 is a flow chart illustrating a method of performing a distance-to-PIM measurement process according to embodiments of the present inventive concepts. As shown in FIG. 4, operations may begin with first and second RF signals being generated (block 210) and applied to a device whose distance-to-PIM is to be measured (the "device under test") (block 220). The first RF signal may be a first continuous wave RF signal and the second RF signal may be a second continuous wave RF signal. The first RF signal may have a first frequency and the second RF signal may have a second frequency, where the first frequency ($F_1$) and the second frequency ($F_2$) are selected such that $F_1 < F_2$ and such that the frequencies are within a transmit band of the device under test, and also may be selected such that a third-order intermodulation product (e.g., $2F_1 - F_2$ or $2F_2 - F_1$) is within the receive band of the device under test. As discussed above, these signals may be amplified and/or combined prior to their application to the device under test (e.g., via power amplifiers 30, 32 and/or a combiner such as combiner 40). In block 230, an output signal may be received from the device under test that includes a PIM signal generated from mixing of the first and second RF signals.

Separate from the application of the first RF signal and the second RF signal to the device under test, a reference signal may be generated (block 225). For example, as discussed above, the first RF signal may be frequency-doubled and the frequency-doubled first RF signal may be mixed with the second RF signal. This mixed signal may be bandpass filtered to provide a reference signal that comprises a frequency of a higher-order intermodulation product. For example, the reference signal may comprise a third order intermodulation product of the first RF signal and the second RF signal, wherein a center frequency of the reference signal is a frequency that is twice a center frequency of the first RF signal (e.g., a center frequency of the frequency-doubled first RF signal) minus a center frequency of the second RF signal.

The output signal from the device under test may be received, for example, at a receiver, which may include an image reject mixer, a bandpass filter, and/or an analog/digital converter. In some embodiments, the image reject mixer and/or the bandpass filter may be used to select and down-convert the output signal to an intermediate frequency signal (block 230). The intermediate frequency signal may then be digitized using the analog/digital converter (block 240).

Similarly, the generated reference signal may be received, for example, at a receiver, which may include an image reject mixer, a bandpass filter, and/or an analog/digital converter. In some embodiments, the image reject mixer and/or the bandpass filter may be used to select and down-convert the reference signal to an intermediate frequency signal (block 235). The intermediate frequency signal may then be digitized using the analog/digital converter (block 245).

The digitized reference signal and the digitized output signal may then be used to calculate a phase difference between the signals. As discussed above, prior to the calculation of the phase difference, a calibration measurement may be applied to the digitized reference signal and the digitized output signal. In block 250, therefore, data corresponding to a previously performed measurement of a low-PIM termination or connection at the first frequency (that is, the frequency of the first RF signal) may be retrieved (or performed, if the RF relay to switch between the termination and the device under test is used). The phase difference, $\varphi$, between the reference signal and the output signal from the device under test may be obtained using Equations (5), (6), (7), (8), and (9), above. In the equations, which are reproduced below for convenience, $D_{r1}$ and $D_{p1}$ denote the digitized reference signal and the PIM signal with the termination, respectively; $D_{r2}$ and $D_{p2}$ denote the digitized reference signal and the PIM signal with the device under test, respectively; $D_{r1T}$ and $D_{r2T}$ denote the transpose of the column vectors $D_{r1}$ and $D_{r2}$, respectively; $D_{r1TH}$ and $D_{p1H}$ denote the Hilbert transform of $D_{r1T}$ and $D_{p1}$, respectively, and * denotes matrix multiplication:

$$Q=\sqrt{(D_{r1T}*D_{r1})(D_{r2T}*D_{r2})} \quad (5)$$

$$C=(D_{r1T}*D_{r2})/Q \quad (6)$$

$$S=(D_{r1TH}*D_{r2})/Q \quad (7)$$

$$D_p=D_{p2}-(CD_{p1}+SD_{p1H}) \quad (8)$$

$$\varphi=\arcsin[(D_{r2T}*D_p)/\sqrt{(D_{r2T}*D_{r2})(D_{pT}*D_p)}] \quad (9)$$

The calculated phase difference may be stored in memory. The method of FIG. 4 may continue, and it may be determined whether additional data is desired or required (block 255). If so (yes branch from block 255), then the first frequency may be incrementally increased or decreased (block 260), and the operations in blocks 210, 220, 225, 230, 235, 240, 245, and 250 may be repeated using the first RF signal having the incrementally increased or decreased frequency. This may result in a further calculated phase difference of the generated reference signal and the output signal (which are both based on the first RF signal) as may be stored as an additional data point that corresponds to the incrementally increased or decreased frequency. In some embodiments, at block 260, the frequency of the second RF signal may be increased or decreased instead of the first RF signal, or in addition to the increasing or decreasing of the frequency of the first RF signal.

In some embodiments, the number of samples that are stored is a function of the sampling rate and the signal-to-noise ratio. In some embodiments, a signal duration of 0.1 s may be sufficient. Once sufficient data has been acquired (no branch from block 255), then a delay may be calculated. Here again is Equation (4).

$$\tau=-d\varphi/d(2\pi f) \quad (4)$$

Based on Equation (4) and the calculated phase differences, a delay ($\tau$) may be determined based on, for example, a slope of a best-fit straight line on a plot of $\varphi$ versus $2\pi(2F_1-F_2)$ (block 270). Using this delay, a distance may be calculated (block 280). This distance may be calculated by multiplying the delay ($\tau$) by the velocity of propagation on the medium that connects the device under test to the test equipment. The velocity of propagation of the medium may be determined from a lookup table or other reference source.

Depending on the length of the RF transmission path to the device under test, it is possible that the calculated location of a potential PIM source is ambiguous. The maximum unambiguous distance is proportional to the reciprocal of the frequency increment from one measurement to the next. Because a phase "difference" of 360 degrees results in two in-phase signals, a result of determining the phase difference may indicate the wrong location if the frequency increment is too large. For example, a phase difference of 20 degrees may be determined. It is possible that this determined phase difference may be at a location associated with a phase difference of 20 degrees, or at locations associated with phase difference greater than 360 degrees (e.g., at a location associated with a phase difference of 380 degrees, at a location associated with a phase difference of 740 degrees, and so on).

Figure 5:
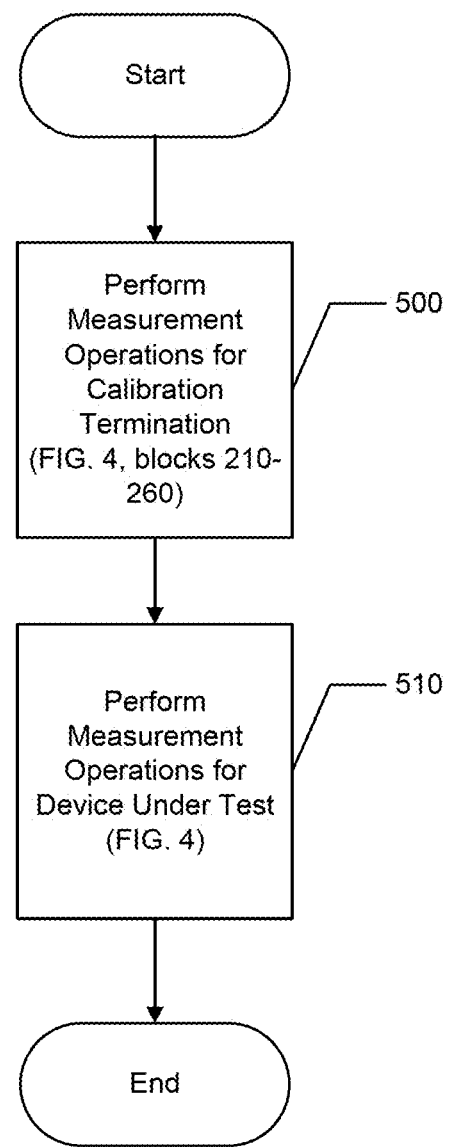
FIG. 5 is a flow chart illustrating a method of performing calibration measurements to determine a distance to a PIM source, according to embodiments of the present inventive concepts.

FIG. 5 is a flow chart illustrating a method of performing a distance-to-PIM measurement process according to embodiments of the present inventive concepts. As shown in FIG. 5, prior to performing the measurement operations of FIG. 4 for a device under test (block 510), some of the operations of FIG. 4 (blocks 210, 220, 225, 230, 235, 240, 245, 250, 255, and 260) may be performed for a calibration termination (block 500). The data collected during these operations may be stored in a memory.

As discussed above, in some embodiments it may be acceptable to forego performing the calibration measurement and the data collected with respect to the low-PIN termination. In such embodiments, in Equations (5), (6), (7), (8), and (9), above, $D_{p1}$ and $D_{p1H}$ may be set to zero, which results in $D_p=D_{p2}$. Hence, to calculate the phase difference, the following substitute equation may be used:

$$\varphi=\arcsin[(D_{rT}*D_p)/\sqrt{(D_{rT}*D_r)(D_{pT}*D_p)}] \quad (10)$$

In Equation (10), above, $D_r$ and $D_p$ denote the digitized reference signal and the PIM signal with the device under test, respectively; $D_{rT}$ and $D_{pT}$ denote the transpose of the column vectors $D_r$ and $D_p$, respectively, and * denotes matrix multiplication. Also, in such embodiments, the calibration operations discussed above with respect to FIG. 5 may be eliminated.

Figure 6:
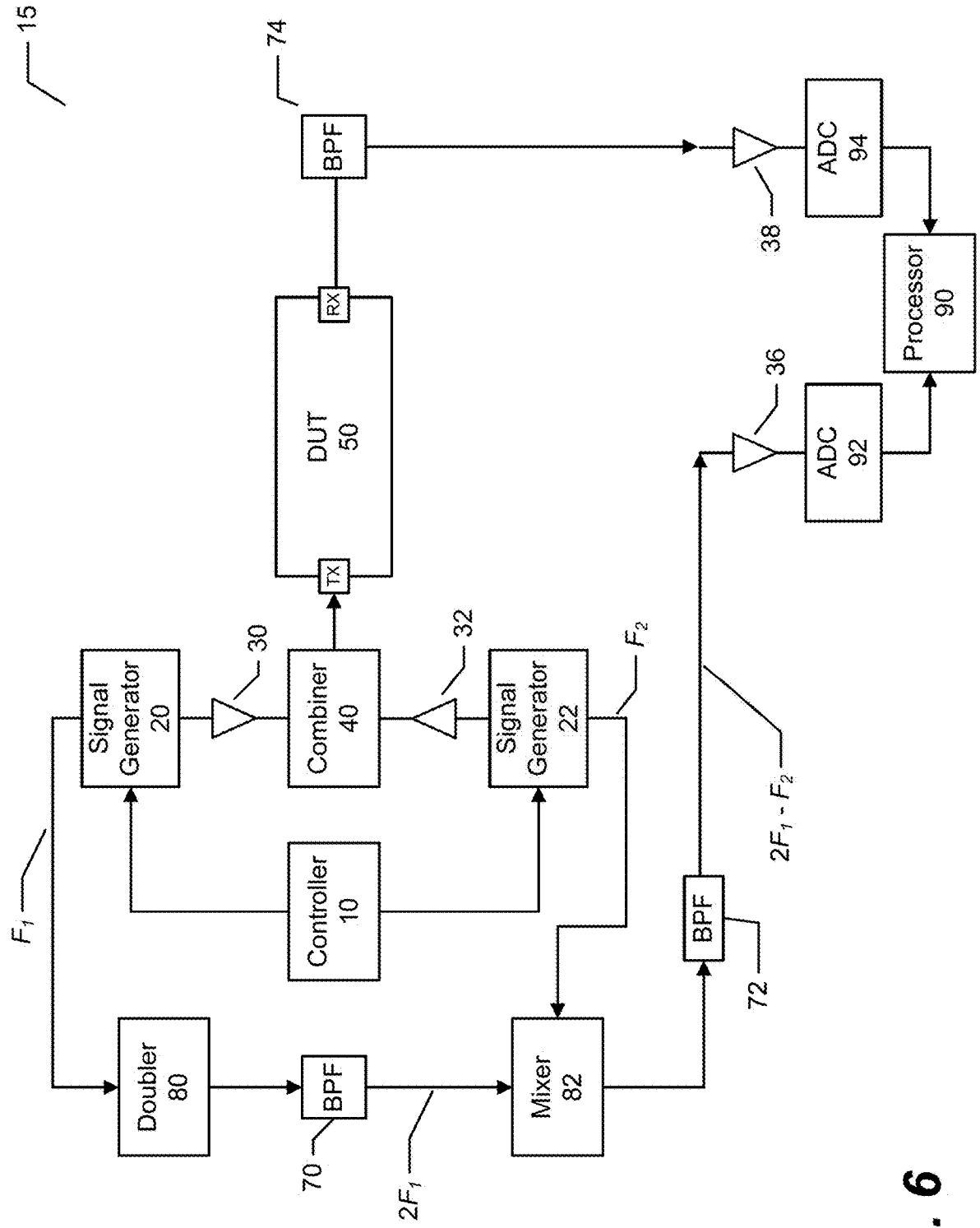
FIG. 6 is a block diagram of a distance-to-PIM measurement apparatus, according to embodiments of the present inventive concepts.
Figure 7:
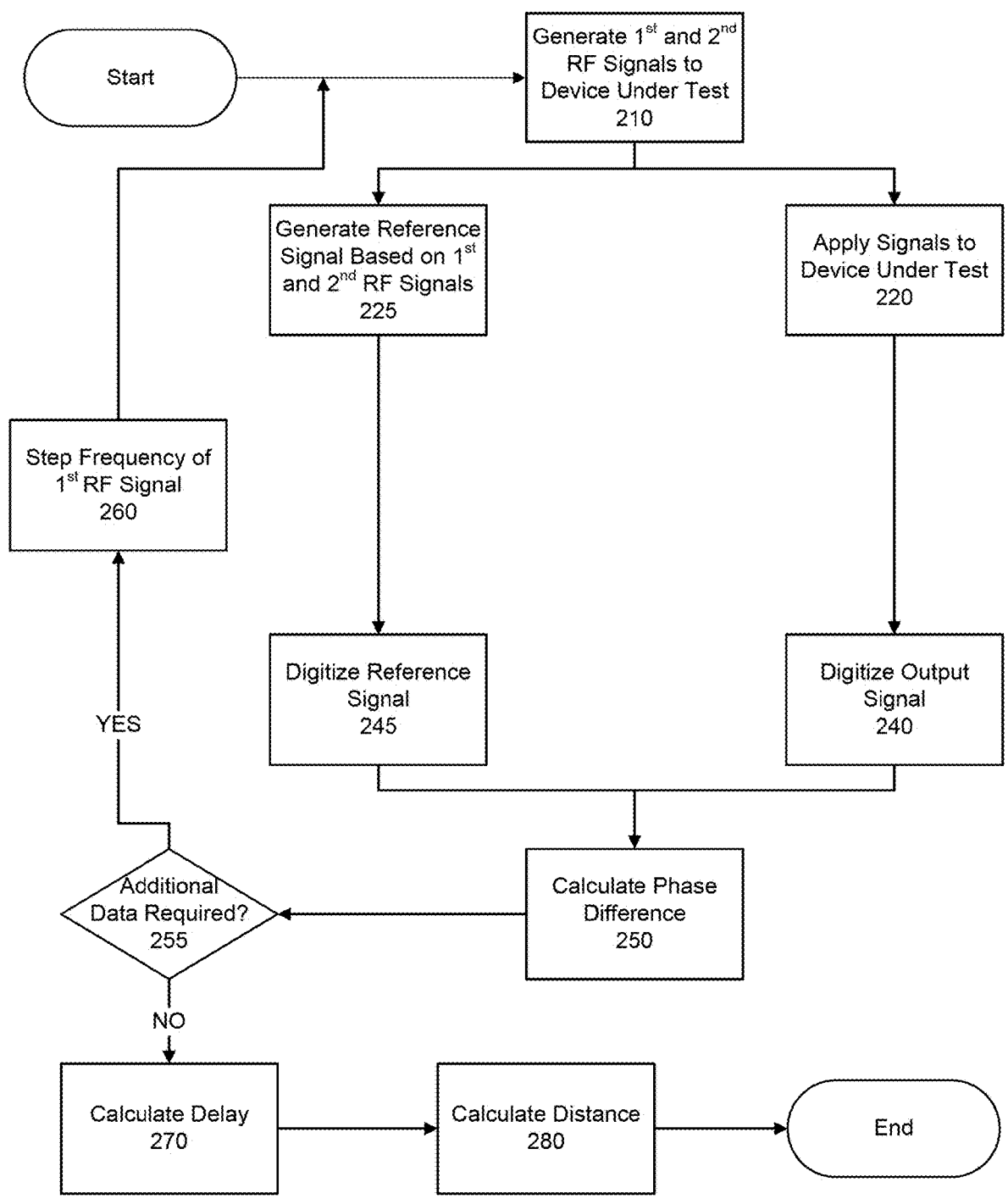
FIG. 7 is a flow chart illustrating a method of performing measurements to determine a distance to a PIM source, according to embodiments of the present inventive concepts.

FIG. 6 and FIG. 7 are similar to FIGS. 1 and 4, respectively, yet illustrate that in some embodiments, the down-conversion to the intermediate frequency or baseband frequency is optional and components and operations related thereto may be omitted. For example, in FIG. 6, a simplified block diagram of a distance-to-PIM measurement apparatus 15 is illustrated. In the distance-to-PIM measurement apparatus 15 illustrated in FIG. 6, the image reject mixers 86, 88, the common local oscillator 84, and the bandpass filters 76 and 78 illustrated in FIG. 1 are absent. Absent from FIG. 7 are the operations related to down-conversion of the received output signal and the generated reference signal. As discussed above, such embodiments may be preferable or utilized where the resultant signals are capable of being digitized directly by an analog/digital converter. In some aspects, the threshold for direct digital conversion may be approximately 2.6 GHz. As improved equipment becomes available in the future, direct digital conversion will likely be possible at higher frequencies.

Figure 8:
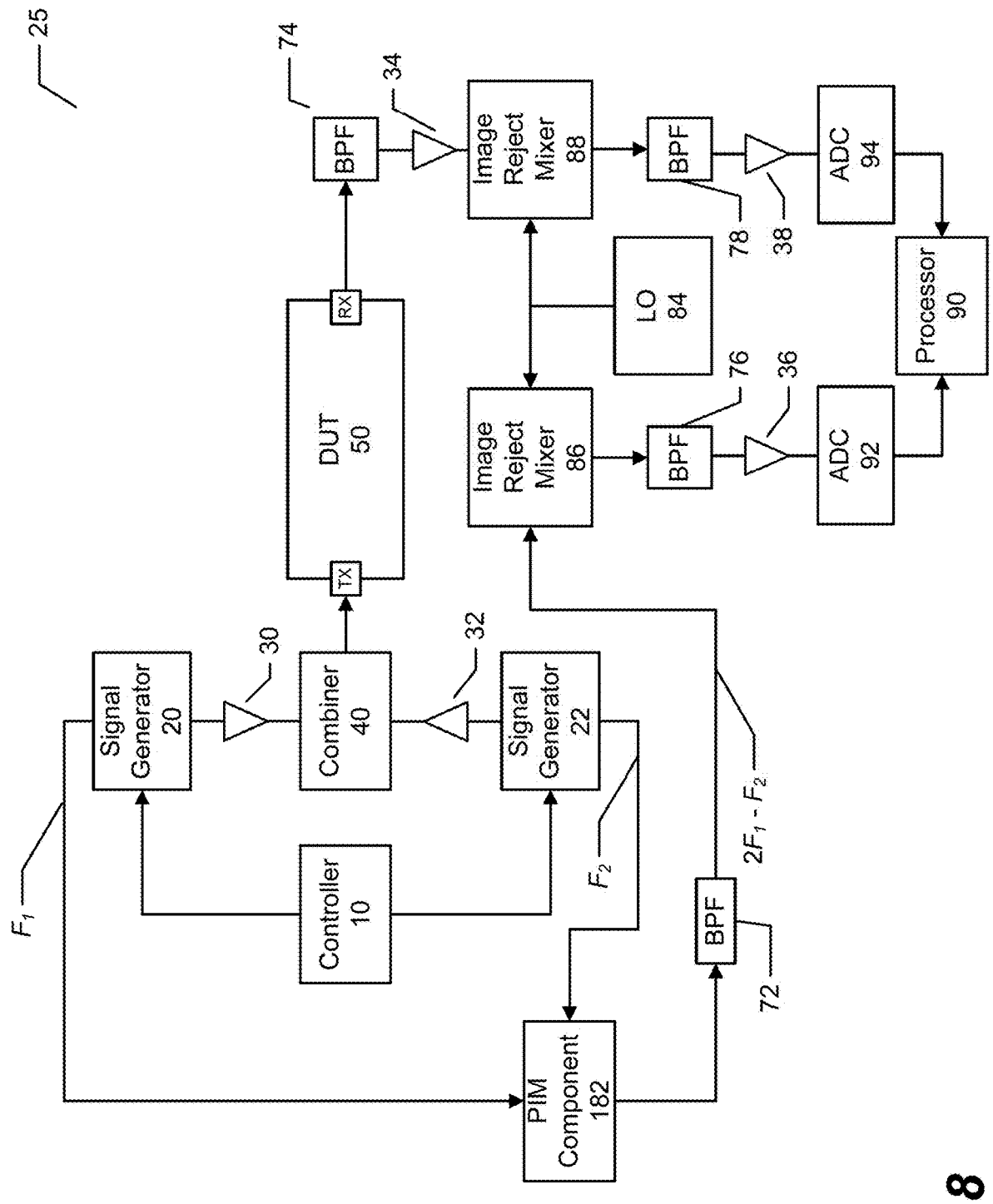
FIG. 8 is a block diagram of a distance-to-PIM measurement apparatus, according to embodiments of the present inventive concepts.

FIG. 8 is similar to FIG. 1, yet illustrates that in some embodiments, the doubler 80 and mixer 82 may be omitted. Instead, as shown in FIG. 8, a simplified block diagram of a distance-to-PIM measurement apparatus 25, a device having a known PIM property (referred to herein as a "PIM component" 182) may be used instead. This may be a non-linear device that is known to generate PIM. For example, the PIM component 182 may be a diode or a voltage-variable capacitor in a non-linear region. It should be appreciated that the concepts illustrated in FIG. 8 and FIG. 6 may be combined: that is, the image reject mixers and the common local oscillator illustrated in FIG. 8 may be omitted, for example where resultant signals are capable of being digitized directly by an analog/digital converter.

Figure 10:
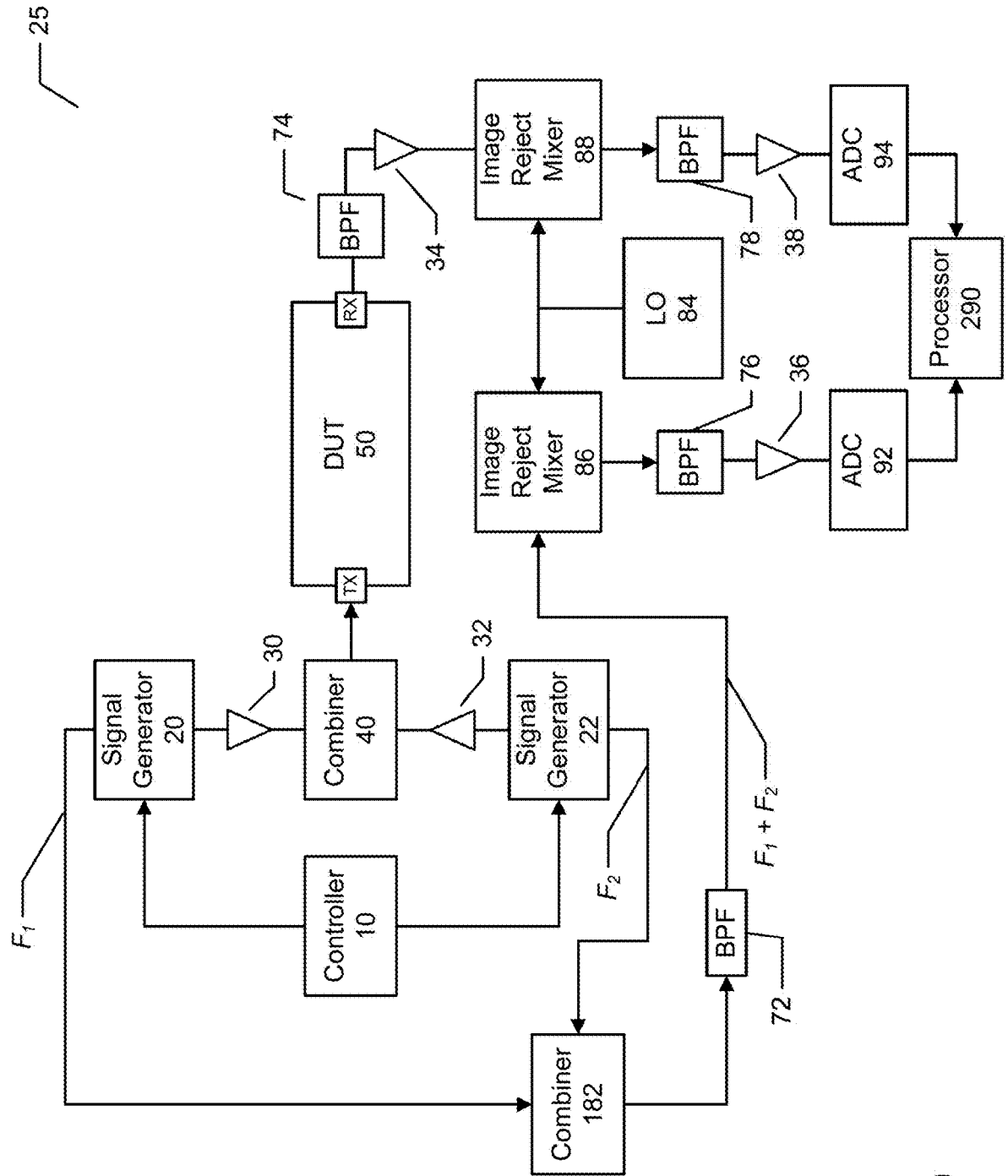
FIG. 10 is a block diagram of a distance-to-PIM measurement apparatus, according to embodiments of the present inventive concepts.

FIG. 10 is a simplified block diagram of a distance-to-PIM measurement apparatus 25. As shown in FIG. 10, the measurement apparatus 25 may include a controller 10, a pair of signal generators 20, 22, a plurality of power amplifiers 30, 32, a plurality of low noise amplifiers 34, 36, 38, a combiner 40, a device under test 50 (which may be mounted, for example, at a test location or on a test bed), a plurality of bandpass filters 72, 74, 76, 78, first and second image reject mixers 86, 88, a local oscillator 84, a pair of analog-to-digital converters (ADCs) 92, 94, and a processor 290. FIG. 10 differs from FIG. 1 in that instead of bandpass filter 70, doubler 80, and mixer 82, a combiner 182 may be present, which combines an output from the first signal generator 20 and an output of the second signal generator 22. The components of FIG. 10 and of FIG. 1 having identical reference signs may be similar, and discussion regarding such components is omitted here in favor of the preceding descriptions of these components.

Figure 12:
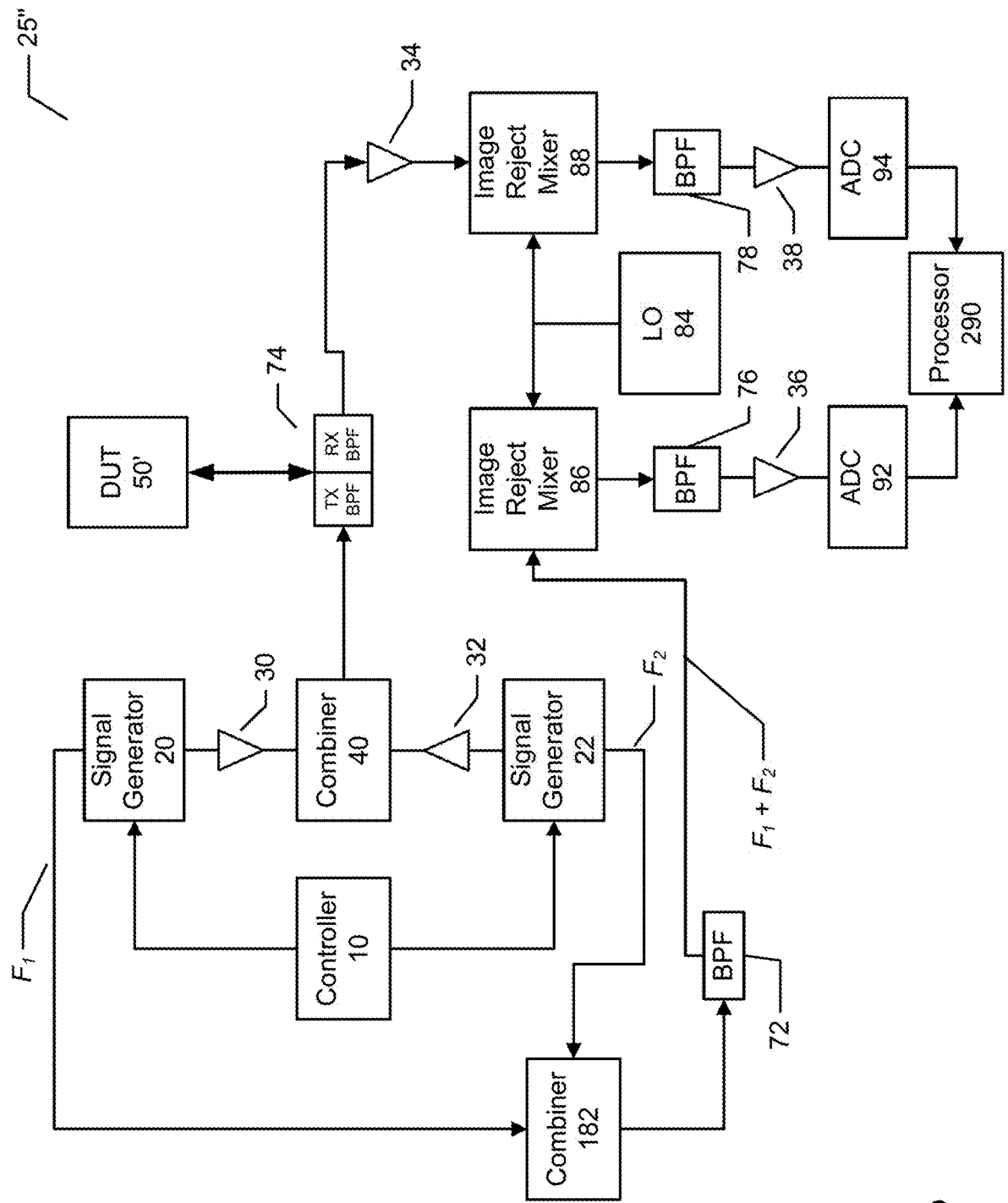
FIG. 12 is a block diagram of a distance-to-PIM measurement apparatus, according to embodiments of the present inventive concepts.

As with FIG. 1, it will be appreciated that the distance-to-PIM measurement apparatus 25 may include other elements that are not depicted in FIG. 1. It will also be appreciated that some devices illustrated in FIG. 10 are optional and/or combinable with other elements. For example, the outputs of the first signal generator 20 and the second signal generator 22 may be of sufficient power that the power amplifiers 30, 32 may be omitted. Although the device under test 50 is illustrated as a two-port device having an input (or transmit) port and an output (or receive) port, it will be appreciated that the device under test 50 may be a single-port device, and a diplexer, duplexer, or the like may be employed to separate the PIM signal from the input signal. For example, FIG. 12 shows a single simplified block diagram of a distance-to-PIM measurement apparatus 25" in which device under test 50' is a single port device. The remaining components of FIG. 12 are similar to those of FIG. 10, and identical reference signs used in the figures refer to similar components. Therefore, discussion of components herein with respect to FIG. 10 is similarly applicable to the components of FIG. 12. In some embodiments, the input port of the device under test 50 may be coupled to a bandpass filter (not shown in FIG. 10 or 12).

Figure 11:
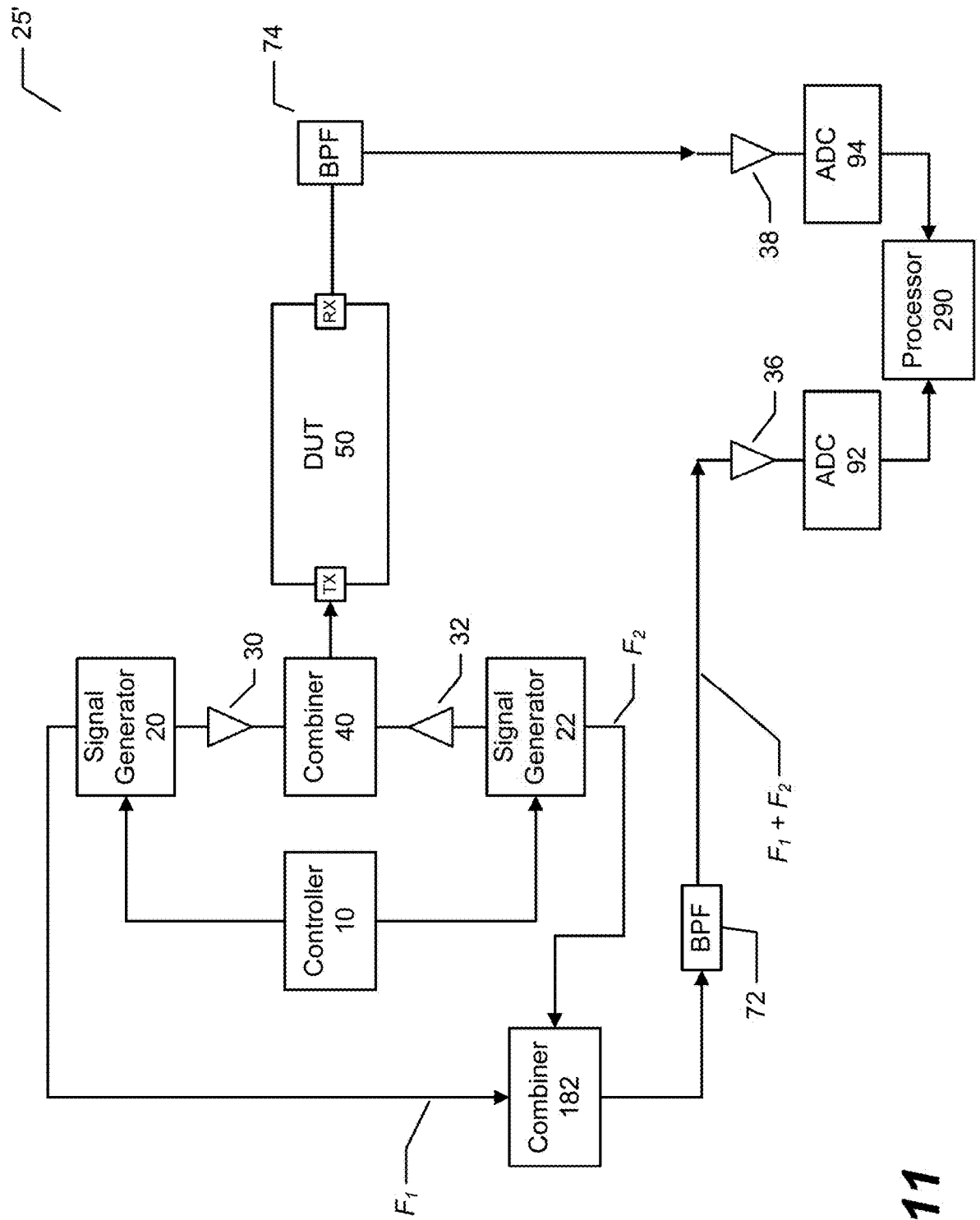
FIG. 11 is a block diagram of a distance-to-PIM measurement apparatus, according to embodiments of the present inventive concepts.

Also, as discussed above with respect to FIG. 6, down-conversion to the intermediate frequency or baseband frequency is optional and components and operations related thereto may be omitted. For example, in FIG. 11, a simplified block diagram of a distance-to-PIM measurement apparatus 25' is illustrated, in which the image reject mixers 86, 88, the common local oscillator 84, and the bandpass filters 76 and 78 illustrated in FIG. 10 are absent. As discussed above, such embodiments may be preferable or utilized where the resultant signals are capable of being digitized directly by an analog/digital converter. In some aspects, the threshold for direct digital conversion may be approximately 2.6 GHz. As improved equipment becomes available in the future, direct digital conversion will likely be possible at higher frequencies. The remaining components of FIG. 11 are similar to those of FIG. 10, and identical reference signs used in the figures refer to similar components. Therefore, discussion of components herein with respect to FIG. 11 is similarly applicable to the components of FIG. 12.

It should be appreciated that the concepts illustrated in FIG. 11 and FIG. 12 may be combined: that is, the image reject mixers and the common local oscillator illustrated in FIG. 12 may be omitted, for example where resultant signals are capable of being digitized directly by an analog/digital converter.

As illustrated in FIGS. 10-12, outputs from the first signal generator 20 and second signal generator 22 of the distance-to-PIM measurement apparatuses 25, 25', and 25" may be combined by combiner 182, resulting in a reference signal that comprises a coupled portion of a first signal $F_1$ and a coupled portion of a second signal $F_2$. A bandpass filter 72 may be used to filter out signals other than the desired coupled portions of the first and second signals, resulting in a generated reference signal.

As with FIG. 1, any PIM signal generated by the devices under test 50 in FIGS. 10-12 will be output at an output of the device under test 50. The output of the device under test 50 may be fed to bandpass filter 74 and then to amplifier 34. In some embodiments, this bandpass filter 74 may filter the transmit frequency band and pass the receive frequency band for the communications system at issue. After bandpass filtering and amplification, the PIM signal may be down-converted and/or digitized, using, for example, an image reject mixer 88, a bandpass filter 78, an amplifier 38, and/or an ADC 94. As with the output from the device under test 50, the generated reference signal may be down-converted and/or digitized, using, for example, an image reject mixer 86, a bandpass filter 76, an amplifier 36, and/or the ADC 92. In some aspects, a common local oscillator 84 may feed both the image reject mixer 88 and the image reject mixer 86. Outputs of the ADCs 92, 94, may be fed into the processor 90, which may be configured to calculate the phase difference between the two signals, calculate a delay based on the phase difference, and calculate a distance based on the delay.

Figure 13:
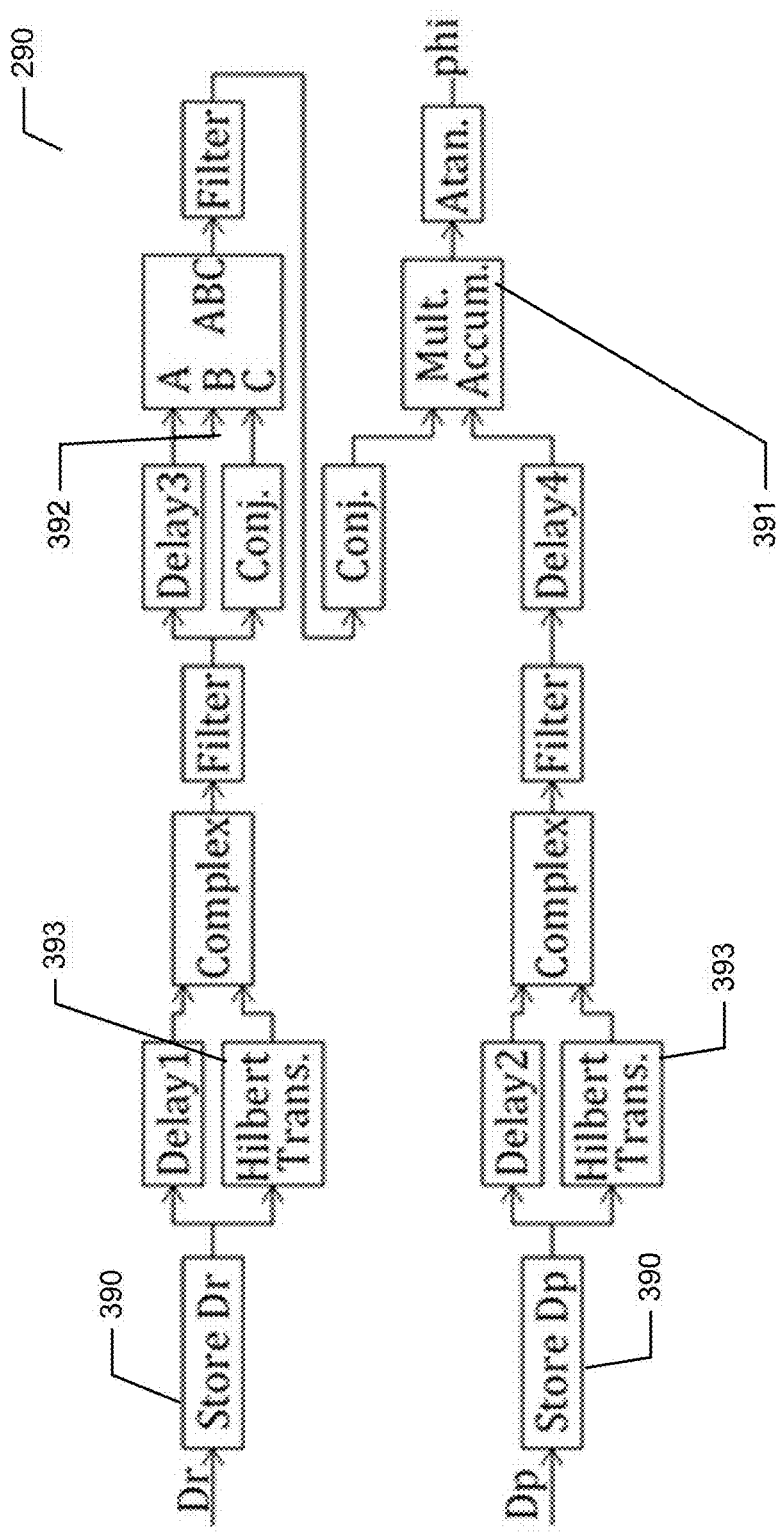
FIG. 13 is a block diagram of a processor within the distance-to-PIM test apparatuses of FIGS. 10-12, according to embodiments of the present inventive concepts.

The processor 290 of FIGS. 10-12 may be implemented differently than the processor 90 of FIG. 1. For example, FIG. 13 is a block diagram of the processor 290 implemented using digital signal processing (DSP) devices, according to embodiments of the present inventive concepts.

As discussed above, data samples may be collected using both the device under test 50 and from a filtered output of the combiner 182. When data is collected for each of these devices, two sets of samples are stored: the samples from the generated reference signal having coupled portions of $F_1$ and $F_2$ (via second ADC 92), and the samples resulting from the output of the device under test (via first ADC 94). Therefore, for each frequency at which the measurements are performed, there are two sets of data samples: device-under-test-output, and reference-output. When these samples are collected in a batch mode, the samples may be stored in respective "Store" components 390 illustrated in FIG. 13. The samples of the reference signal, Dr1, are stored in "Store Dr1" and the samples of the device-under-test signal, Dp1, are stored in "Store Dp1." The remaining blocks of processor 290, illustrated in FIG. 13, provide arithmetic and/or matrix multiplication processing to provide the operands of Equations (11), (12), (13), and (14), which are discussed below. For example, matrix multiplication is performed in the multiply-accumulate unit 391, complex conjugation may be performed in conjugation units 392, and the Hilbert transformation may be performed in Hilbert transformation units 393. In some embodiments, the Cordic algorithm may be used to calculate the arctangent function. Another method to evaluate the arctangent function may be to use a look-up table. It will also be appreciated that some devices illustrated in FIG. 13 are optional and/or combinable with other elements.

The flow charts of FIG. 4 and FIG. 7 are operable using the distance-to-measurement apparatuses 25, 25', and 25" of FIGS. 10-12, with the reference signal comprising the coupled portions of the first signal $F_1$ and the second signal $F_2$. Reference is made to the previous discussions of the blocks of these flow charts. Where the distance-to-measurement apparatuses 25, 25', and 25" of FIGS. 10-12 are used, in block 250, the digitized reference signal and the digitized signal of the device under test may be used to calculate a phase difference between the signals.

In block 250, therefore, the phase difference, φ, between the reference signal and the output signal from the device under test may be obtained using Equations (11), (12), (13), and (14) below.

$$D_a = D + jH(D) \tag{11}$$

$$D_i = D_{ra} \cdot D_{ra} \cdot D_{ra}' \tag{12}$$

$$P = P_r * P_p \tag{13}$$

$$\varphi = \arctan(\text{Imag}(P), \text{Real}(P)) \tag{14}$$

First, Equation (11) is used to determine the analytic forms of the digitized reference signal ($D_r$) and the digitized signal output from the device under test ($D_p$). Applying Equation (11) to both signals results in the analytic form of the signals. It is advantageous to convert the real signals to their analytic form, for example because analytic signals do not contain negative frequencies. In Equation (11), j is the square root of −1, and H(D) is the Hilbert transform of D. The Hilbert transform can be performed using, for example, a Fourier transform technique as described in S. L. Marple, Jr.: "Computing the Discrete-Time Analytic Signal via FFT," IEEE Transactions on Signal Processing, Vol. 47, No. 9, 2600-2603, the entire contents of which are incorporated by reference herein. In some embodiments, the Hilbert transform is performed using, for example, a Hilbert transform filter, as described in Oppenheim, et al. "Chapter 11: Discrete Hilbert Transforms," from "Discrete-time signal processing,"; Prentice Hall, 1999, the entire contents of which are incorporated by reference herein. $D_{ra}$ and $D_{pa}$ herein refer to the analytic forms of the digitized reference signal ($D_r$) and the digitized signal output from the device under test ($D_p$).

A reference intermodulation signal may be calculated from $D_{ra}$ using Equation (12). In Equation (12), · represents sample-by-sample multiplication and $D_{ra}'$ represents the complex conjugate of $D_{ra}$. The resultant signal, $D_i$, includes both the lower and upper frequency intermodulation products (e.g., lower product may be $2F_1-F_2$, and the higher product may be $2F_2-F_1$, where $F_2>F_1$). From these, one of the intermodulation products may be selected via a bandpass filter. This filtered reference signal may be referred to as $P_r$.

The digitized signal from the device under test may be converted to analytic form as discussed above. A PIM component signal may be extracted from the analytic form of the signal using a narrow band bandpass filter. The filtered PIM signal may be referred to as $P_p$.

The phase difference between $P_r$ and $P_p$ may be calculated using Equations (13) and (14). First, using Equation (13), $P_r$ and $P_p$ are multiplied using matrix multiplication, for example using a multiply-accumulate unit 391 in processor 290 of FIGS. 10-13. Then, using Equation (14), the arctangent of the imaginary and real parts of the result of the matrix multiplication, P, may be found, using an arctangent function for angles ranging from −π to π radians. In some embodiments, the arctangent can be calculated using the Cordic algorithm.

The signal processing described with respect to Equations (11)-(14) may be repeated for a series of frequencies $F_1$ or $F_2$, such that the resulting PIM frequencies span the desired receive band. In some aspects, as the output of the arctangent may range from −π to π radians, the calculated phase difference may need to be "unwrapped" whenever the absolute value of the difference between successive angels exceeds π radians. This may be performed by replacing the angle with its a complement. In some aspects, the series of frequencies used in the calculations may be selected to ensure that the delay can be determined unambiguously. For example, the frequency step size may be selected to be less than a reciprocal of the maximum delay.

The calculated phase difference may be used as described above to determine a delay. Based on Equation (4) and the calculated phase differences, a delay (τ) may be determined based on, for example, a slope of a best-fit straight line on a plot of φ versus $2\pi(2F_1-F_2)$ (block 270). Using this delay, a distance may be calculated (block 280). This distance may be calculated by multiplying the delay (τ) by the velocity of propagation on the medium that connects the device under test to the test equipment. The velocity of propagation of the medium may be determined from a lookup table or other reference source.

Depending on the length of the RF transmission path to the device under test, it is possible that the calculated location of a potential PIM source is ambiguous. The maximum unambiguous distance is proportional to the reciprocal of the frequency increment from one measurement to the next. Because a phase "difference" of 360 degrees results in two in-phase signals, a result of determining the phase difference may indicate the wrong location if the frequency increment is too large. For example, a phase difference of 20 degrees may be determined. It is possible that this determined phase difference may be at a location associated with a phase difference of 20 degrees, or at locations associated with phase difference greater than 360 degrees (e.g., at a location associated with a phase difference of 380 degrees, at a location associated with a phase difference of 740 degrees, and so on).

In some aspects, the filters described in the present disclosure, including those of FIGS. 10-12, may shift the phase of the signal by an amount which can vary with frequency. This shifting may be compensated for in different ways. For example, the phase difference versus frequency measured with a known PIM source located close to the filters may be subtracted from the phase difference measured with the device under test. As another example, the phase angle of the s-parameter of the transmit band filter at frequencies $F_1$ and $F_2$ may be applied to the $F_1$ and $F_2$ signals used to generate the reference signal, and the phase angle of the s-parameter of the receive band filter at frequencies $F_1$ and $F_2$ may be applied to the calculated intermodulation product, thereby providing a simulation of a PIM source located close to the transmit and receive filters.

An alternative method of obtaining the phase difference between the real digitized device-under-test PIM signal $R_p$ and a reference intermodulation signal $R_i$ may make use of the properties of the discrete Fourier transform (DFT) without actually computing $R_i$ from the real reference signal $R_s$, which contains the down-converted and digitized frequencies $F_1$ and $F_2$. This alternative method may be more computationally efficient. Writing $R_s$ in magnitude-phase form as:

$$R_s = m_1 e^{j(2\pi f_1 t + \varphi_1)} + m_2 e^{j(2\pi f_2 t + \varphi_2)} \quad (15)$$

In Equation (15), $f_1$ and $f_2$ are the frequencies of the digitized continuous wave signals with respective phase angles $\varphi_1$ and $\varphi_2$.

The reference intermodulation signal $R_i$ may be given by:

$$R_i = m_3 e^{j(2\pi f_3 t + \varphi_3)} \quad (16)$$

In Equation (16), $f_3 = 2f_1 - f_2$ or $f_3 = 2f_2 - f_1$, depending on which intermodulation product is of interest.

From Equations (15) and (16), it follows that $\varphi_3 = 2\varphi_1 - \varphi_2$ for the intermodulation product having a frequency of $2f_1 - f_2$, and $\varphi_3 = 2\varphi_2 - \varphi_1$ for the intermodulation product with frequency $2f_2 - f_1$. The phase angles may be obtained from the DFTs of $R_s$ and $R_p$.

In order to obtain accurate phase angles from the DFTs of the signals, two conditions may need to be satisfied. First, the frequency difference between successive values of $f_1$, $f_2$, and $f_3$ may need to be selected such that the captured waveforms include an integer number of cycles. This may avoid the existence of a discontinuity between the beginning and the end of each waveform. Second, a number of samples used for the DFTs may need to be selected so that each of the three frequencies $f_1$, $f_2$, and $f_3$ are coincident with an element (e.g., a bin) of the DFT. Both of these conditions may be satisfied by using the following relations:

$$|\Delta f| = F_s/n \quad (17)$$

where $F_s$ is the sampling rate and n is a positive integer chosen so that the frequency increment $\Delta f$ is close to the desired frequency step, and the frequencies $f_1$, $f_2$, and $f_3$ are each an integer multiple of $\Delta f$; and $$N = F_s/|\Delta f| \quad (18)$$

where N is the minimum number of samples used for the DFTs.

Furthermore, to improve accuracy in the presence of noise, the number of samples can be an integer multiple of N.

Denoting the complex values of the DFT at the frequencies $f_1$, $f_2$, $f_3$ by $C_1$, $C_2$, $C_3$, respectively, the desired phase difference is obtained from the following equations:

$$C = C_2 C_3 (C_1^\backslash)^2 \text{ for } f_3 = 2f_1 - f_2 \quad (19)$$

or $$C = C_1 C_3 (C_2^\backslash)^2 \text{ for } f_3 = 2f_2 - f_1 \quad (20)$$

$$\varphi = a\tan 2(C_i, C_r) \quad (21)$$

where $C_1^\backslash$ is the complex conjugate of $C_1$, $C_2^\backslash$ is the complex conjugate of $C_2$, $C_i$ and $C_r$ are the imaginary and the real parts of C, respectively, and a tan 2 is the arctangent function for angles ranging from $-\pi$ to $\pi$ radians.

While the present inventive concepts have been described above primarily with reference to the accompanying drawings, it will be appreciated that the inventive concepts are not limited to the illustrated embodiments; rather, these embodiments are intended to fully and completely disclose the inventive concepts to those skilled in this art. In the drawings, like numbers refer to like elements throughout. Thicknesses and dimensions of some components may be exaggerated for clarity.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, operations, elements, and/or components, but do not preclude the presence or addition of one or more other features, operations, elements, components, and/or groups thereof.

Herein, the terms "attached", "connected", "interconnected", "contacting", "mounted" and the like can mean either direct or indirect attachment or contact between elements, unless stated otherwise.

It will also be appreciated that the various embodiments described above may be combined in any and all ways to provide additional embodiments.

The foregoing is illustrative of the present inventive concepts and is not to be construed as limiting thereof. Although exemplary embodiments of these inventive concepts have been described, those skilled in the art will readily appreciate that many modifications are possible in the exemplary embodiments without materially departing from the novel teachings and advantages of these inventive concepts. Accordingly, all such modifications are intended to be included within the scope of these inventive concepts as defined in the claims. The inventive concepts are defined by the following claims, with equivalents of the claims to be included therein.

That which is claimed is:

1. A passive intermodulation (PIM) measurement apparatus, comprising:
   at least one signal generator that is configured to generate a first continuous wave radiofrequency (RF) signal having a first RF frequency and a second continuous wave RF signal having a second RF frequency;
   a test apparatus configured to hold a device under test, the device under test configured to receive the first and second continuous wave RF signals from the at least one signal generator;
   a first analog/digital converter configured to receive a reference signal comprising the first continuous wave RF signal and the second continuous wave RF signal and to digitize the reference signal, resulting in a digitized reference signal;
   a second analog/digital converter configured to receive an output signal from the device under test and to digitize the output signal, resulting in a digitized output signal; and
   a processor configured to calculate a distance to a source of passive intermodulation within the device under test, wherein the processor is configured to calculate the distance based on a phase difference calculated by the processor between the digitized reference signal and the digitized output signal.

2. The PIM measurement apparatus of claim 1, further comprising:
   a first image reject mixer configured to down-convert the reference signal prior to digitization of the reference signal by the first analog/digital converter; and
   a second image reject mixer configured to down-convert the output signal prior to digitization of the output signal by the second analog/digital converter.

3. The PIM measurement apparatus of claim 2, further comprising a local oscillator common to both the first and second image reject mixers.

4. The PIM measurement apparatus of claim 1, wherein the processor is configured to calculate the phase difference using an arcsine function.

5. The PIM measurement apparatus of claim 1, wherein the processor is configured to calculate the phase difference using an arctangent function.

6. The PIM measurement apparatus of claim 1, wherein the processor is configured to calculate the phase difference using discrete Fourier transforms (DFTs) of the digitized reference signal and the digitized output signal.

7. The PIM measurement apparatus of claim 1, wherein the processor is coupled to a memory storing results of a calibration of the PIM measurement apparatus using a low-PIM termination, wherein the results of the calibration comprise a termination reference signal and a termination output signal.

8. The PIM measurement apparatus of claim 1, wherein the at least one signal generator comprises a first signal generator configured to generate the first continuous wave RF signal and a second signal generator configured to generate the second continuous wave RF signal.

9. The PIM measurement apparatus of claim 8, further comprising:
   a frequency-doubler configured to double the first RF frequency of the first continuous wave RF signal, resulting in a frequency-doubled first continuous wave RF signal; and
   a mixer configured to mix the frequency-doubled first continuous wave RF signal and the second continuous wave RF signal, resulting in the reference signal.

10. The PIM measurement apparatus of claim 8, further comprising a combiner that couples a portion of the first continuous wave RF signal and the second continuous wave RF signal, resulting in the reference signal.

11. The PIM measurement apparatus of claim 1, wherein the device under test is a two-port device.

12. The PIM measurement apparatus of claim 1, wherein the device under test is a one-port device, and wherein the PIM measurement apparatus further comprises a diplexer or duplexer configured to separate a signal input to the device under test from a signal output by the device under test.

13. A passive intermodulation (PIM) measurement apparatus, comprising:
    at least one signal generator that is configured to generate a first continuous wave radiofrequency (RF) signal having a first RF frequency and a second continuous wave RF signal having a second RF frequency;
    a test apparatus configured to hold a device under test, the device under test configured to receive the first and second continuous wave RF signals from the at least one signal generator;
    a processor configured to receive an output signal from the device under test and a reference signal comprising a combination of the first continuous wave RF signal and the second continuous wave RF signal; and
    a memory storing results of a calibration of the PIM measurement apparatus using a low-PIM termination, wherein the processor is configured to calculate a distance to a source of passive intermodulation within the device under test based on the results of the calibration and based on a phase difference calculated by the processor between a digitized reference signal and a digitized output signal.

14. The PIM measurement apparatus of claim 13, further comprising:
    a first analog/digital converter configured to receive and digitize the reference signal, resulting in a digitized reference signal; and
    a second analog/digital converter configured to receive and digitize the output signal from the device under test, resulting in a digitized output signal.

15. The PIM measurement apparatus of claim 14, further comprising:
    a first image reject mixer configured to down-convert the reference signal prior to digitization of the reference signal by the first analog/digital converter; and
    a second image reject mixer configured to down-convert the output signal prior to digitization of the output signal by the second analog/digital converter.

16. A passive intermodulation (PIM) measurement apparatus, comprising:
    at least one signal generator that is configured to generate a plurality of first continuous wave radiofrequency (RF) signals each having an RF frequency within a frequency range, and a second continuous wave RF signal having a second RF frequency outside of the frequency range;
    a combiner configured to receive each first continuous wave RF signal and the second continuous wave RF signal and output a reference signal comprising a combination thereof, resulting in a plurality of reference signals;
    a test apparatus configured to hold a device under test, the device under test configured to receive each first continuous wave RF signal and the second continuous wave RF signal and output an output signal, resulting in a plurality of output signals; and a processor configured to calculate a distance to a source of passive intermodulation within the device under test, wherein the processor is configured to calculate the distance based on phase differences calculated by the processor between respectively corresponding ones of the plurality of reference signals and the plurality of output signals.

17. The PIM measurement apparatus of claim 16, wherein the processor is configured to calculate the phase differences using an arcsine function.

18. The PIM measurement apparatus of claim 16, wherein the processor is configured to calculate the phase differences using an arctangent function.

19. The PIM measurement apparatus of claim 16, wherein the processor is configured to calculate the phase differences using discrete Fourier transforms (DFTs) of the reference signals and the output signals.

20. The PIM measurement apparatus of claim 16, wherein the processor is coupled to a memory storing results of a calibration of the PIM measurement apparatus using a low-PIM termination and wherein the processor is further configured to calculate the distance based on the results of the calibration.

* * * * *